(12) United States Patent
Martin et al.

(10) Patent No.: US 11,621,387 B2
(45) Date of Patent: Apr. 4, 2023

(54) QUANTUM DEVICE WITH LOW SURFACE LOSSES

(71) Applicant: International Business Machines Corporation, Armonk, NY (US)

(72) Inventors: Yves Martin, Ossining, NY (US); Jason S. Orcutt, Katonah, NY (US); Antoine Hervier, New York, NY (US); Martin O. Sandberg, Ossining, NY (US); Harry Jonathon Mamin, Palo Alto, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 155 days.

(21) Appl. No.: 17/198,666

(22) Filed: Mar. 11, 2021

(65) Prior Publication Data
US 2022/0293844 A1    Sep. 15, 2022

(51) Int. Cl.
 *H01L 39/22* (2006.01)
 *H01L 29/66* (2006.01)
 (Continued)

(52) U.S. Cl.
 CPC ...... *H01L 39/223* (2013.01); *H01L 29/66977* (2013.01); *H01L 39/025* (2013.01); *H01L 39/2493* (2013.01)

(58) Field of Classification Search
 CPC . H01L 29/66977; H01L 39/025; H01L 39/24; H01L 27/18; H01L 39/223–226;
 (Continued)

(56) References Cited

U.S. PATENT DOCUMENTS 10,256,392 B1 *   4/2019   Brink ............... B82Y 10/00
10,304,005 B2     5/2019   Chow et al.
(Continued)

FOREIGN PATENT DOCUMENTS

WO   2016/183213 A1   11/2016
WO   2019032115 A1    2/2019
(Continued)

OTHER PUBLICATIONS

Steffen et al., "Recent research trends for high coherence quantum circuits," Supercond Sci. Technol. 30 030301, 2017, 5 pages.
(Continued)

*Primary Examiner* — Shahed Ahmed
(74) *Attorney, Agent, or Firm* — Amin, Turocy & Watson, LLP

(57) ABSTRACT

Circuits and methods of operation that can facilitate reducing surface losses for quantum devices are provided. In one example, a quantum device can comprise a dielectric layer, a first electrode, and a second electrode. The dielectric layer can comprise a recess formed in a surface of the dielectric layer that reduces a thickness of the dielectric layer from a first thickness external to a footprint of the recess to a second thickness within the footprint of the recess. The second thickness can be less than the first thickness. The first electrode can be positioned within the footprint of the recess. The second electrode can be electrically isolated from the first electrode by the dielectric layer. The first and second electrodes can be positioned on opposing surfaces of the dielectric layer.

21 Claims, 16 Drawing Sheets

(51) Int. Cl.
   *H01L 39/02* (2006.01)
   *H01L 39/24* (2006.01)
(58) Field of Classification Search
   CPC ....... H01L 39/2493–2496; H01L 39/00–2496;
        H01L 21/76891; H01L 21/76224–76237;
        H01L 21/0206–02065; G06N 10/40;
        G06N 10/00
   See application file for complete search history.

(56) References Cited

U.S. PATENT DOCUMENTS

| | | | |
|---|---|---|---|
| 10,546,992 | B2 | 1/2020 | Fuhrer et al. |
| 10,665,769 | B2 | 5/2020 | Caudillo et al. |
| 10,693,566 | B2 | 6/2020 | Sliwa et al. |
| 10,748,961 | B2 | 8/2020 | Michalak et al. |
| 2016/0148112 | A1 | 5/2016 | Kwon |
| 2019/0043919 | A1* | 2/2019 | George .................. H01L 28/10 |
| 2020/0127187 | A1 | 4/2020 | Megrant |
| 2020/0161531 | A1* | 5/2020 | Olivadese .............. B82Y 10/00 |
| 2022/0285482 | A1* | 9/2022 | Potocnik ................ H01L 39/24 |

FOREIGN PATENT DOCUMENTS

| WO | WO-2019117973 | A1 * | 6/2019 |
|---|---|---|---|
| WO | 2022/115278 | A1 | 6/2022 |

OTHER PUBLICATIONS

Dial et al., "Bulk and surface loss in superconducting transmon qubits," arXiv:1509.03859v1 [quant-ph] Sep. 13, 2015, 4 pages.

Niepce et al., "Geometric Scaling of Two-Level-System Loss in Superconducting Resonators," arXiv:1908.02606v1 [physics.app-ph] Aug. 7, 2019, 9 pages.

Calusine et al., "Analysis and mitigation of interface losses in trenched superconducting coplanar waveguide resonators," arXiv:1709.10015v1 [quant-ph] Sep. 28, 2017, 10 pages.

Woods et al., "Determining interface dielectric losses in superconducting coplanar waveguide resonators," arXiv:1808.10347v1 [quant-ph] Aug. 30, 2018, 11 pages.

International Search Report and Written Opinion received for PCT Application Serial No. PCT/EP2022/056043 dated Aug. 12, 2022, 12 pages.

* cited by examiner

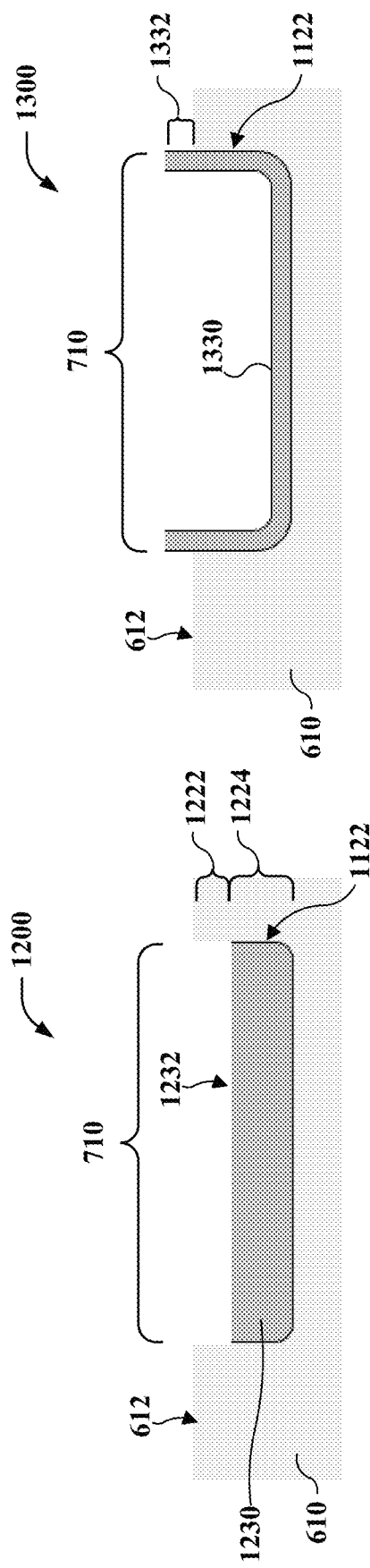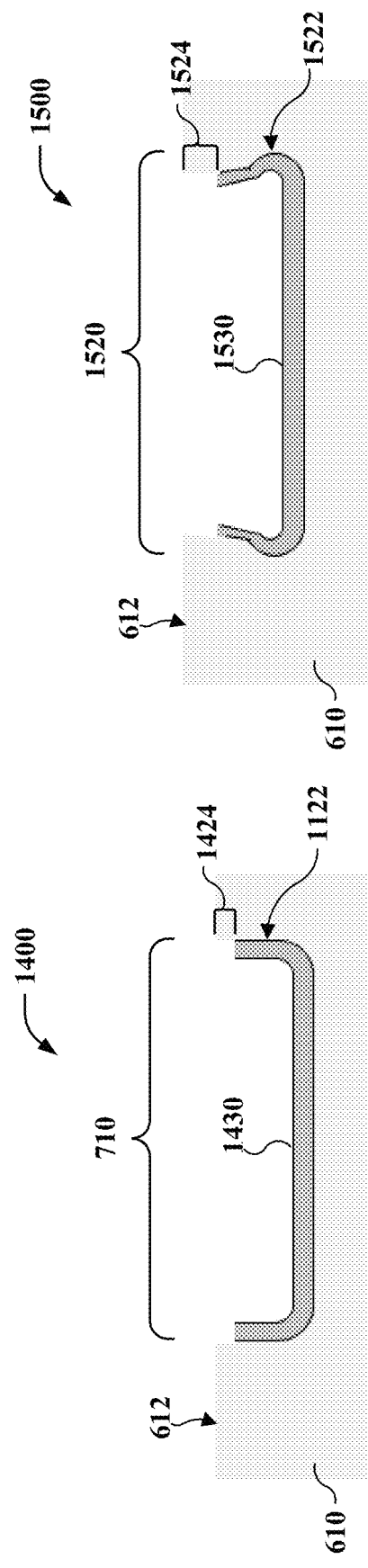

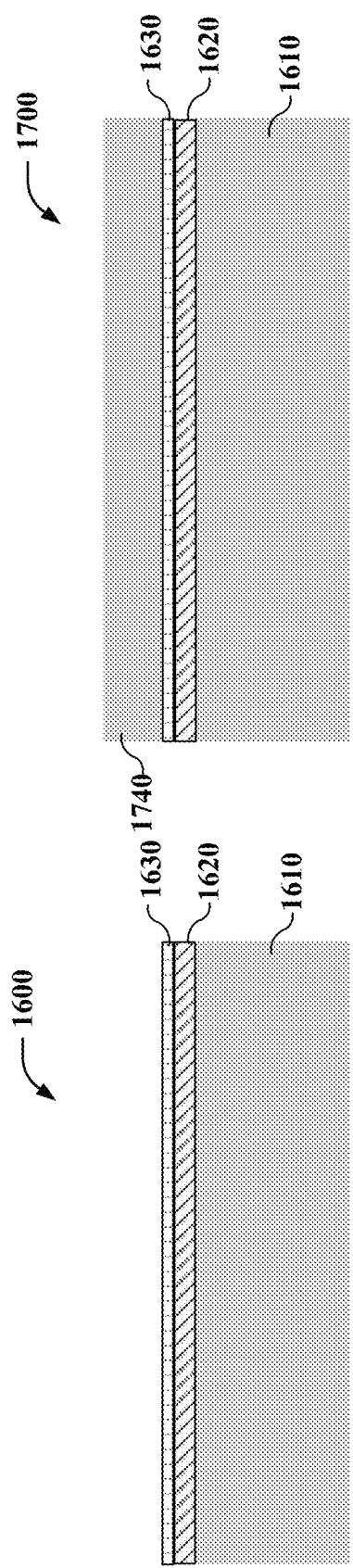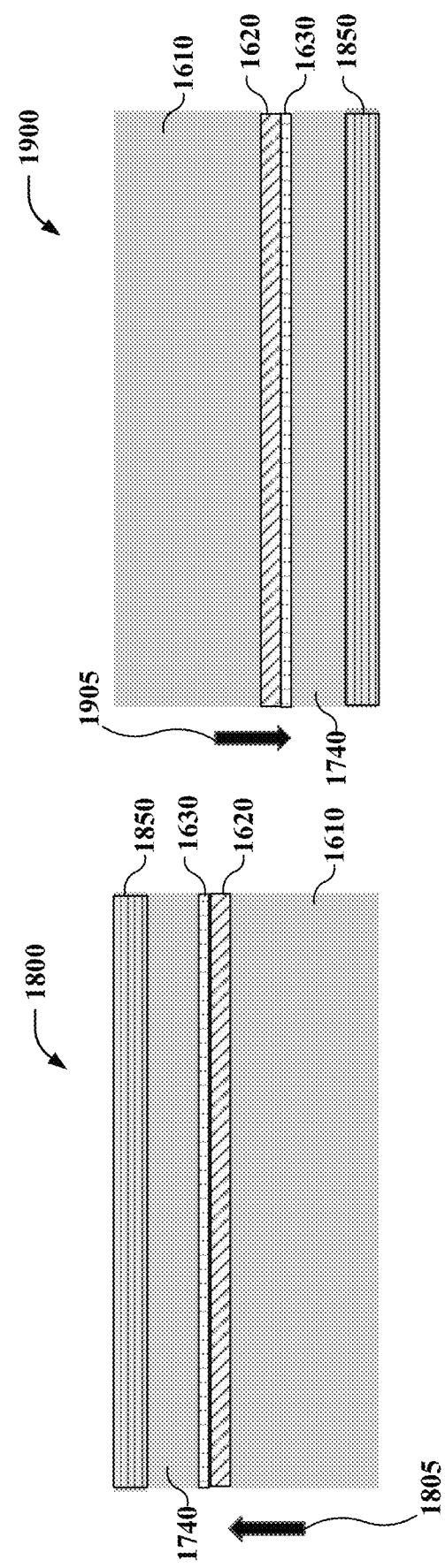

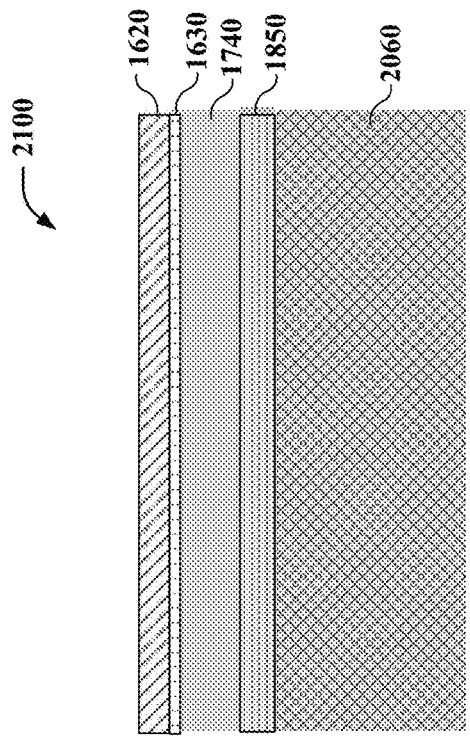
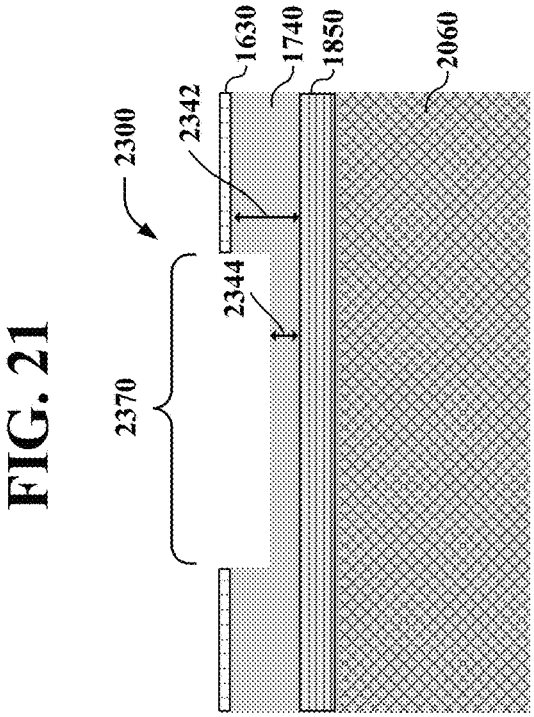
FIG. 21
FIG. 23
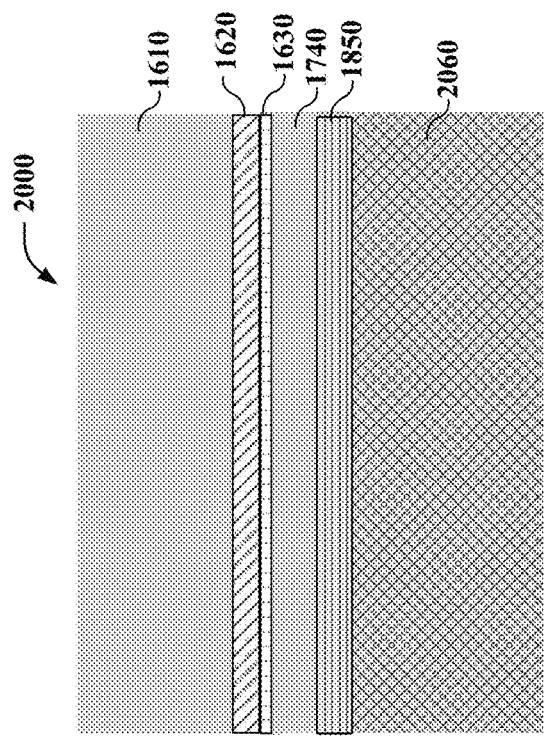
FIG. 20
FIG. 22

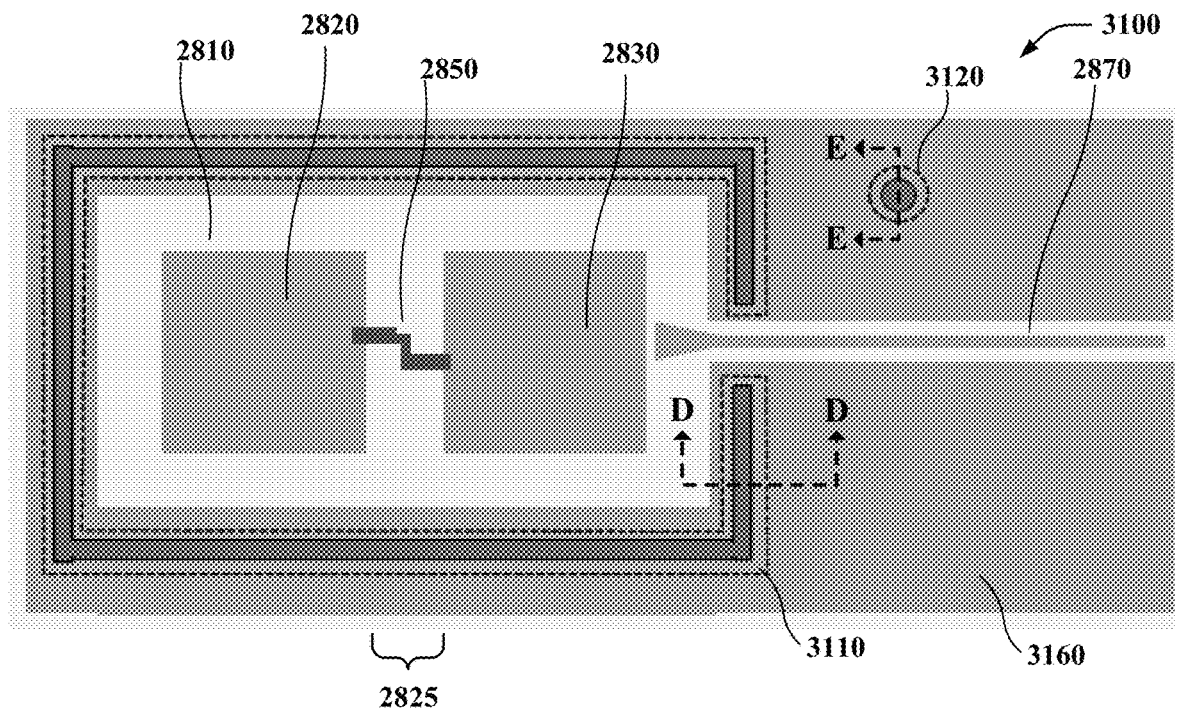
FIG. 31
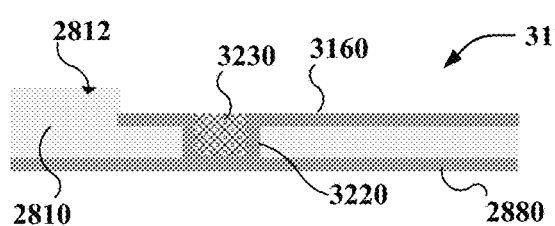   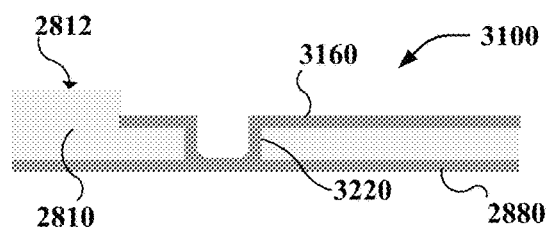
FIG. 32   FIG. 33
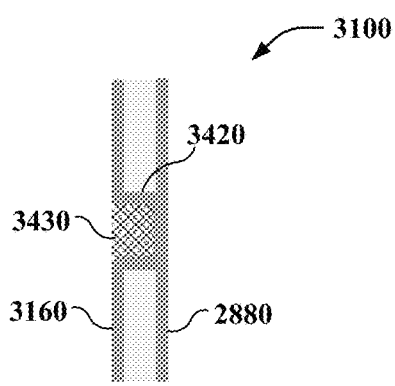   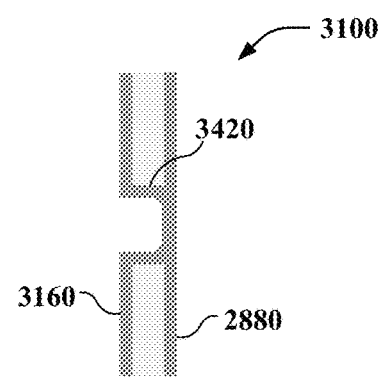
FIG. 34   FIG. 35

QUANTUM DEVICE WITH LOW SURFACE LOSSES

BACKGROUND

One or more embodiments herein relate to quantum devices, and more specifically, to circuits and methods of operation that facilitate reducing surface losses for quantum devices.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, apparatus, and/or computer program products that can facilitate reducing surface losses for quantum devices are described.

According to an embodiment, a quantum device can comprise a dielectric layer, a first electrode, and a second electrode. The dielectric layer can comprise a recess formed in a first surface of the dielectric layer. The recess can reduce a thickness of the dielectric layer from a first thickness external to a footprint of the recess to a second thickness within the footprint of the recess. The second thickness can be less than the first thickness. The first electrode can be positioned within the footprint of the recess. The second electrode can be positioned on a second surface of the dielectric layer. The second electrode can be electrically isolated from the first electrode by the dielectric layer. The first surface and the second surface can be positioned on opposing surfaces of the dielectric layer.

According to another embodiment, a quantum device can comprise a first capacitor and a Josephson junction. The first capacitor can have first and second electrodes that are electrically isolated by a dielectric layer intervening between the first and second electrodes. The first and second electrodes can be positioned on opposing surfaces of the dielectric layer. The first electrode is positioned within a footprint of a recess formed in a surface of the dielectric layer that reduces a thickness of the dielectric layer from a first thickness external to a footprint of the recess to a second thickness within the footprint of the recess. The second thickness can be less than the first thickness. The Josephson junction can be coupled to the first electrode of the first capacitor. The Josephson junction is positioned on the surface of the dielectric layer in a gap that intervenes between the first electrode and a third electrode of a second capacitor.

According to another embodiment, a method can comprise forming a recess in a first surface of a dielectric layer. The recess can reduce a thickness of the dielectric layer from a first thickness external to a footprint of the recess to a second thickness within the footprint of the recess. The second thickness can be less than the first thickness. The method can further comprise forming a first electrode positioned within the footprint of the recess. The method can further comprise forming a second electrode positioned on a second surface of the dielectric layer and electrically isolated from the first electrode by the dielectric layer. The first surface and the second surface can be positioned on opposing surfaces of the dielectric layer.

DESCRIPTION OF THE DRAWINGS

FIGS. 12-15 illustrate cross-sectional views of example, non-limiting devices with recessed electrodes, in accordance with one or more embodiments described herein.

FIG. 16. illustrates a cross-sectional view of an example, non-limiting device that can facilitate reducing surface losses for quantum devices, in accordance with one or more embodiments described herein.

FIG. 17 illustrates a cross-sectional view of the example, non-limiting device of FIG. 16 after growing or forming a dielectric layer, in accordance with one or more embodiments described herein.

FIG. 18 illustrates a cross-sectional view of the example, non-limiting device of FIG. 17 after depositing one or more metal layers, in accordance with one or more embodiments described herein.

FIG. 19 illustrates a cross-sectional view of the example, non-limiting device of FIG. 18 after inverting or flipping an orientation of that device, in accordance with one or more embodiments described herein.

FIG. 20 illustrates a cross-sectional view of the example, non-limiting device of FIG. 19 after bonding a handle layer to the one or more metal layers, in accordance with one or more embodiments described herein.

FIG. 21 illustrates a cross-sectional view of the example, non-limiting device of FIG. 20 after removing the substrate, in accordance with one or more embodiments described herein.

FIG. 22 illustrates a cross-sectional view of the example, non-limiting device of FIG. 21 after removing the insulator layer, in accordance with one or more embodiments described herein.

FIG. 23 illustrates a cross-sectional view of the example, non-limiting device of FIG. 22 after forming a recess, in accordance with one or more embodiments described herein.

FIG. 31 illustrates a top view of an example, non-limiting device that can facilitate cross talk reduction and/or inter-qubit decoupling, in accordance with one or more embodiments described herein.

FIG. 32 illustrates a cross-sectional view of the example, non-limiting device of FIG. 31 taken along line D-D, in accordance with one or more embodiments described herein.

FIG. 33 illustrates another cross-sectional view of the example, non-limiting device of FIG. 31 taken along line D-D, in accordance with one or more embodiments described herein.

FIG. 34 illustrates a cross-sectional view of the example, non-limiting device of FIG. 31 taken along line E-E, in accordance with one or more embodiments described herein.

FIG. 35 illustrates another cross-sectional view of the example, non-limiting device of FIG. 31 taken along line E-E, in accordance with one or more embodiments described herein.

DETAILED DESCRIPTION

Figure 1:
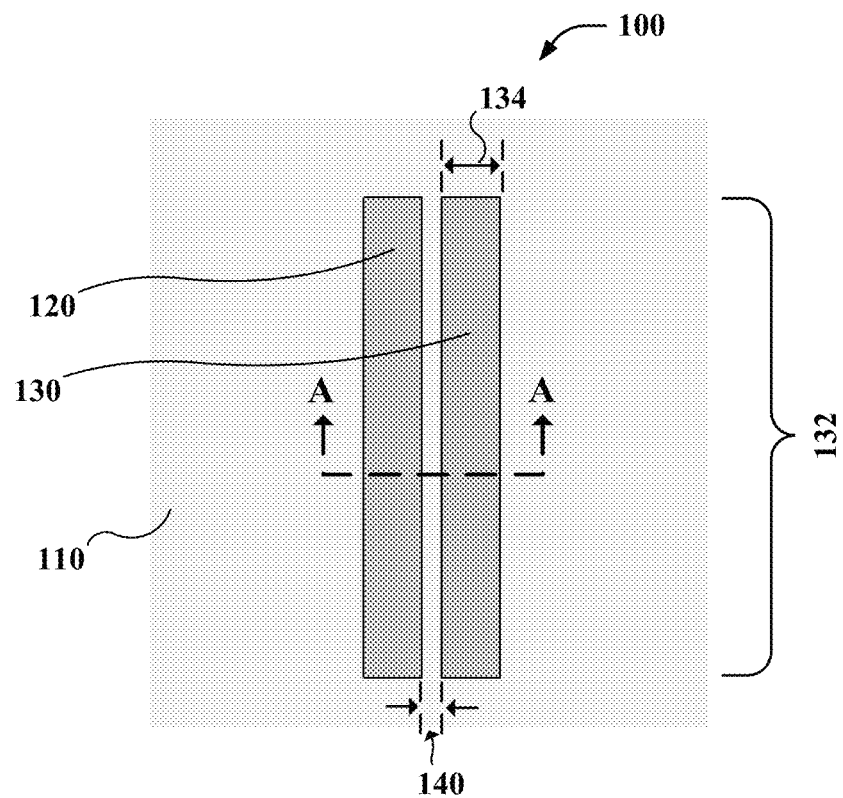
FIG. 1 illustrates a top view of an example, non-limiting device comprising transmon elements, in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The following definitions are used throughout the present disclosure, unless specifically indicated otherwise. A "transmon" denotes a superconducting quantum system with a capacitor and Josephson junction in parallel, that serves as a building block for quantum bits (qubits). Resonance quality factor, Q, and T1 denote metrics that quantify coherence, a criterion of a transmon as a resonator. T1 is the approximate time a transmon stays on its first excited level. Q and T1 may be related as $T1=Q/2\pi F$, where F is the resonance frequency of a transmon. Q or T1 can be measured at low temperature and for minimum amount of energy (e.g., a temperature on the order of 10 milli-Kelvin, or 0.01 Kelvin; and/or an energy corresponding to approximately to the product hF, where h is Plank's constant and F the transmon frequency) in a transmon that can correspond to the transition between ground and a first level. "Losses" denote physical mechanisms in or around transmon elements that dissipate some of the energy of a transmon and limit the time it stays on the first level. The term "surface losses" denote sources of loss typically located at a top surface of a transmon component. The term "Two-Level Systems" (TLS) denotes a two-state quantum system that can exist in a superposition of two quantum states. Unwanted TLSs can act as local discrete energy capture sites (and source of loss) for a transmon. Unwanted TLSs are typically found in disordered areas of a material, away from perfect crystalline regions, such as at surfaces or boundaries where natural atomic bounds are strained or broken.

Classical computers operate on binary digits (or bits) that store or represent information as binary states to perform computing and information processing functions. In contrast, quantum computing devices operate on quantum bits (or qubits) that store or represent information as both the binary states and superpositions of the binary states. To that end, quantum computing devices utilize quantum-mechanical phenomena, such as entanglement and interference.

A quantum computation uses a qubit as its essential unit instead of a classical computing bit. The qubit (e.g., quantum binary digit) is the quantum-mechanical analog of the classical bit. Whereas classical bits can employ on only one of two basis states (e.g., 0 or 1), qubits can employ on superpositions of those basis states (e.g., $\alpha|0\rangle+\beta|1\rangle$, where $\alpha$ and $\beta$ are complex scalars such that $|\alpha|^2+|\beta|^2=1$), allowing a number of qubits to theoretically hold exponentially more information than a same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, etc. Qubits, partaking of the quantum mystique, can occupy a superposition of 0 and 1 states. It's not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1. General quantum programs require coordination of quantum and classical parts of a computation. One way to think about general quantum programs is to identify processes and abstractions involved in specifying a quantum algorithm, transforming the algorithm into executable form, running an experiment or simulation, and analyzing the results. By processing information using laws of quantum mechanics, quantum computers offer novel ways to perform computation tasks such as molecular calculations, financial risk calculations, optimization and many more.

Transmons can be viewed as leading candidates toward creating quantum bits (or qubits) for advancing scalability of quantum computing devices. One metric for quantifying the quality of a transmon relates to a resonance quality of the transmon at low temperature. That metric can be measured as either a quality factor Q or a coherence time T1. Generally, good values for Q and T1 for a transmon with an approximate resonance frequency of 5 gigahertz (GHz) can be 5,000,000 and 0.15 millisecond (mS), respectively. Such values for Q and T1 can correspond to average qubit values achievable in the best quantum processors produced to-date, with a number of qubits of about 50 qubits. However, further improvement is needed for these values of Q and T1 by about two orders of magnitude to realize quantum computing devices having a quantum advantage over classical computers.

A wide range of loss mechanisms can potentially negatively impact the obtainable values for Q and T1. One potential source of loss for a transmon can involve imperfections in materials (e.g., silicon (Si) and/or silicon dioxide ($SiO_2$)) proximate to a top surface of the transmon. Some such imperfections have been observed acting as TLSs that can have transitions at frequencies near frequencies (e.g., resonance frequencies) of a transmon thereby detracting from an energy of the transmon. Losses associated with such imperfections can limit the maximum obtainable values for Q and T1.

Embodiments of the techniques described herein can provide transmon element geometries and/or arrangements that may facilitate reducing surface losses for transmons. Losses can generally be driven by electric fields present a surface of a transmon, particularly at the surface of dielectric elements comprising the transmon. Embodiments of the present disclosure provide structures that can reduce the amplitude of electric fields at a surface of a transmon, particularly at the surface of dielectric elements comprising the transmon. Compatibility between aspects of one or more embodiments described herein and present designs can facilitate incorporating such aspects into some current fabrication techniques. One or more embodiments described herein can reduce a footprint of a transmon to facilitate increasing the density of transmons in quantum hardware. One or more embodiments described herein can facilitate reducing radiative losses for transmons by increasing a portion of an electric field that resides within a dielectric comprising a transmon thereby decreasing a portion of the electric field that resides external to the dielectric.

Figure 2:
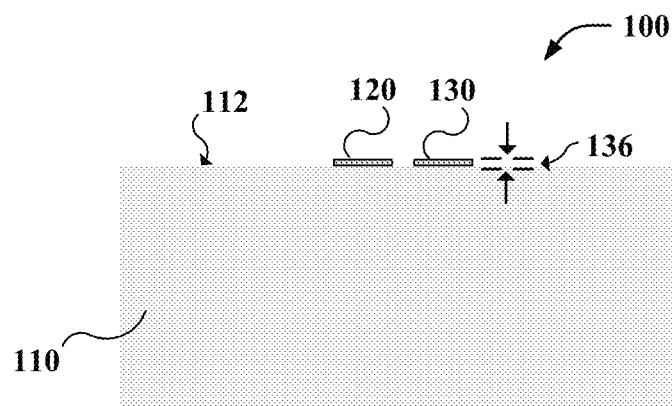
FIG. 2 illustrates a cross-sectional view of the example, non-limiting device of FIG. 1 taken along line A-A, in accordance with one or more embodiments described herein.

FIGS. 1-2 illustrate an example, non-limiting device 100 comprising transmon elements. In particular, FIGS. 1-2 illustrate a top view of device 100 and a cross-sectional view of device 100 taken along line A-A, respectively. As shown by FIGS. 1-2, device 100 comprises electrodes 120 and 130 formed on a surface 112 of a dielectric layer 110. Dielectric layer 110 can comprise any material having electrically insulating properties including, but not limited to, sapphire, diamond, as well semiconductor elements such as Si, silicon-germanium (SiGe), silicon-germanium-carbon (SiGeC), silicon carbide (SiC), germanium (Ge) alloys, gallium-arsenide (GaAs) and the like, knowing that semiconductors can behave as insulators at operating temperatures of below 1 degree Kelvin. Electrodes 120 and/or 130 can comprise titanium nitride (TiN), aluminum (Al), niobium (Nb), rhenium (Re), tin (Sn), a non-superconductor, a superconductor, a ferromagnetic metal, or a combination thereof. Electrodes 120 and/or 130 can comprise a length dimension, a width dimension, and a height dimension. For example, electrode 130 comprises length dimension 132, width dimension 134, and height dimension 136. In an embodiment, length dimension 132 can be between approximately 100 micrometer (μm) to approximately 1000 μm; width dimension 134 can be between approximately 10 μm to approximately 100 μm; and height dimension 136 can be between approximately 20 nanometer (nm) to approximately 200 nm.

Electrodes 120 and 130 can comprise a transmon when coupled to a tunneling junction (not shown) positioned on surface 112 in a gap 140 that intervenes between electrodes 120 and 130. In an embodiment, a transmon implemented using device 100 can be referred to as a standard transmon. By way of example, the tunneling junction can be implemented as a Josephson junction. In this example, the tunneling junction can become a Josephson junction when electrodes (e.g., electrodes 120 and/or 130) of the tunneling junction become superconductors (e.g., when an operating temperature falls below a critical temperature of a material (e.g., metal) comprising the electrodes. Electrodes 120 and 130 can form a capacitor providing capacitance for the transmon in which electrodes 120 and 130 correspond to plates of that capacitor. The tunneling junction (not shown) can form an electrical bridge within an intra-electrode area of surface 112 occupied by gap 140. The tunneling junction can occupy a relatively minute subset of the intra-electrode area of surface 112 occupied by gap 140. For example, a geometry of the intra-electrode area can be defined by multiplying a dimension (e.g., width) of gap 140 by length dimension 132 of electrode 130. In this example, the tunneling junction can occupy a relatively minute subset of that geometry. As such, the capacitor formed by electrodes 120 and 130 can represent the largest element of the transmon.

An electrical voltage can be present in the intra-electrode area between electrodes 120 and 130 when the transmon is electrically driven to its high energy level. An electrical field can build proximate (e.g., around and between) to electrodes 120 and 130 when the electrical voltage is present. In particular, the highest amplitude of the electrical field can generally be found in the intra-electrode area. More specifically, the highest amplitude of the electrical field can be found along the respective edges of electrodes 120 and 130. A driving term for a lossy medium such as a TLS can be expressed as $\varepsilon E^2$, where $\varepsilon$ denotes a dielectric constant of the lossy medium and E denotes an amplitude of an electric field (electric field amplitude). Of note with respect to that expression is that a square of the electric field amplitude is involved in losses.

Figure 3:
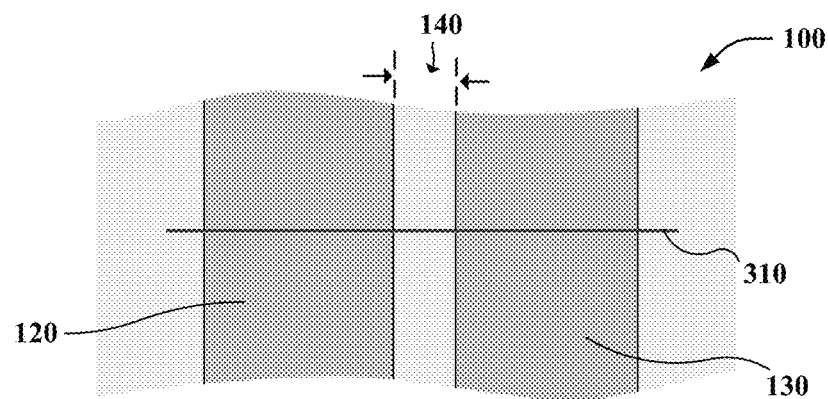
FIG. 3 illustrates a close-up view depicting a surface of the example, non-limiting device of FIG. 1, in accordance with one or more embodiments described herein.
Figure 4:
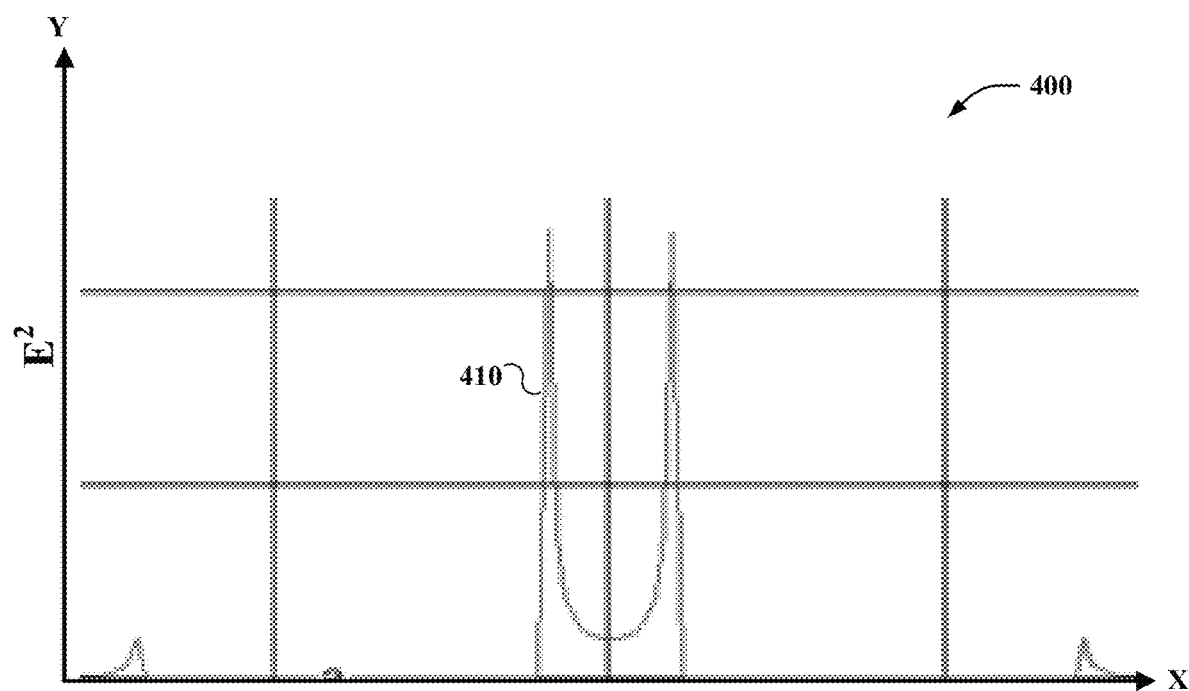
FIG. 4 illustrates an example, non-limiting graph depicting a calculated profile of a square of an electric field amplitude plotted along on a surface of the example, non-limiting device of FIG. 1, in accordance with one or more embodiments described herein.
Figure 5:
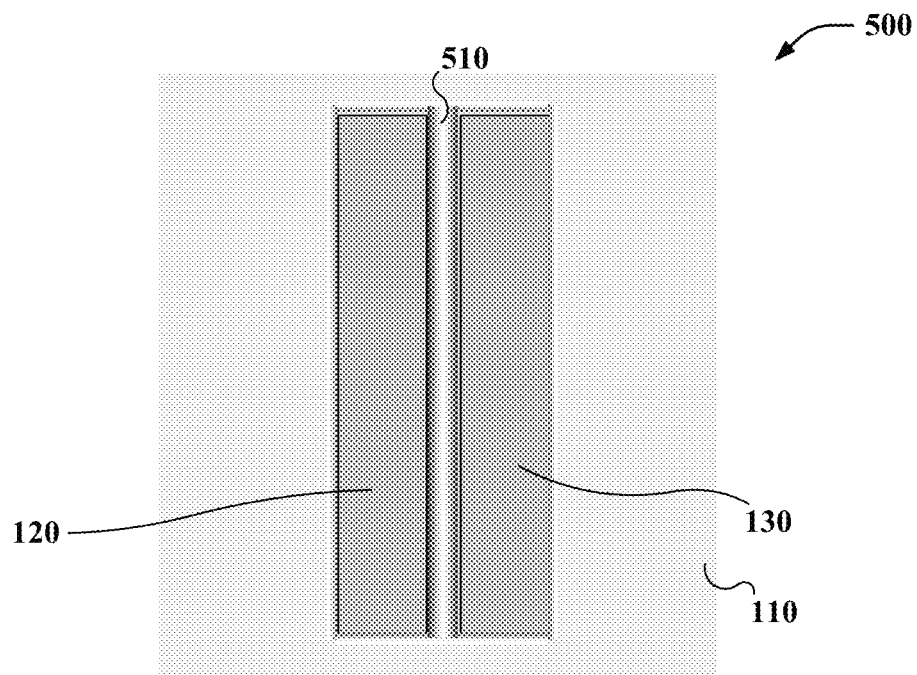
FIG. 5 illustrates an example, non-limiting distribution of surface losses associated with the example, non-limiting device of FIG. 1, in accordance with one or more embodiments described herein.

FIGS. 3-5 illustrate example, non-limiting distributions of an electric field and corresponding surface losses associated with device 100. In particular, FIG. 4 illustrates an example, non-limiting graph 400 depicting a calculated profile 410 of the square of the electric field amplitude (corresponding to a Y-axis of graph 400) plotted along line 310 of FIG. 3 (corresponding to an X-axis of graph 400). Graph 400 shows that two main peaks of calculated profile 410 correspond with the respective edges of electrodes 120 and 130 that define gap 140. Graph 400 further shows that the electric field can be distributed elsewhere in device 100. For example, graph 400 includes two minor peaks of calculated profile 410 that correspond with the respective edges of electrodes 120 and 130 that oppose the edges that define gap 140. As another example, electric field amplitude values of calculated profile 410 that are associated with an interior portion of gap 140 do not reach zero.

As discussed above, the driving term for a lossy medium such as a TLS can be expressed as $\varepsilon E^2$. Therefore, the distribution of electric field amplitude values along line 310 depicted in graph 400 suggests that surface losses predominantly occur for device 100 within a relatively small area of surface 112 proximate to electrodes 120 and 130. A majority of those surface losses can be localized to the intra-electrode area occupied by gap 140 along the respective edges of electrodes 120 and 130 that define gap 140, as suggested by the position of the two main peaks of the calculated profile depicted by graph 400. Such distribution of surface losses 510 associated with device 100 are illustrated by the varying intensities of surface losses 510 shown by FIG. 5.

Figure 6:
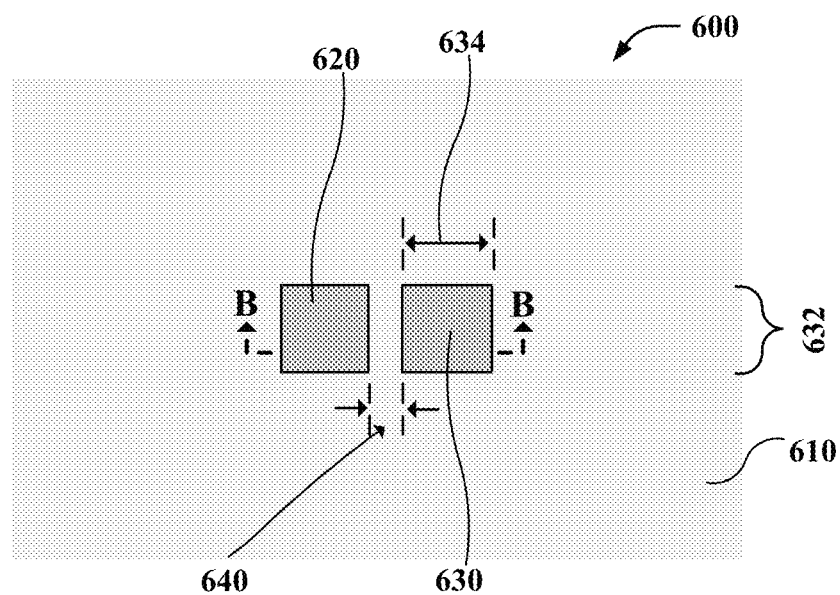
FIG. 6 illustrates a top view of an example, non-limiting device that can facilitate reducing surface losses for quantum devices, in accordance with one or more embodiments described herein.
Figure 7:
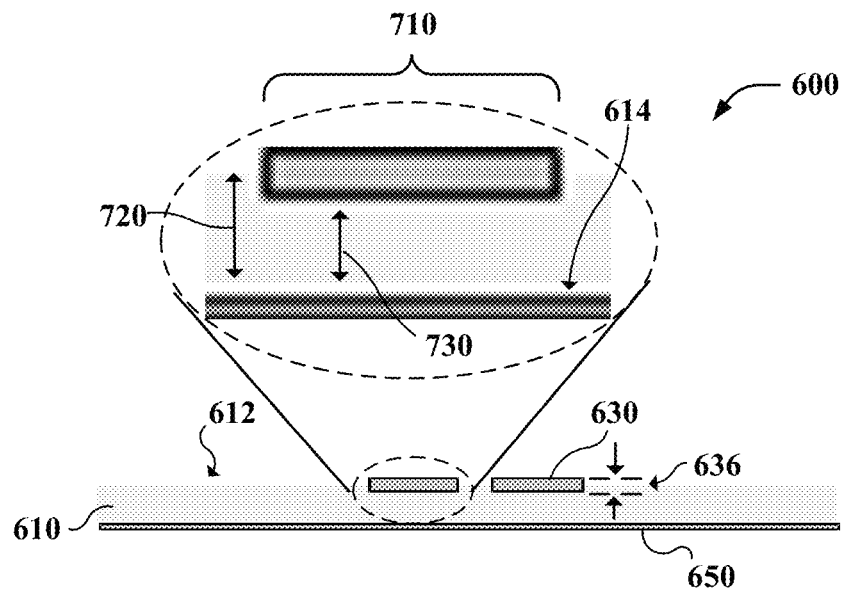
FIG. 7 illustrates a cross-sectional view of the example, non-limiting device of FIG. 6 taken along line B-B, in accordance with one or more embodiments described herein.

FIGS. 6-7 illustrate an example, non-limiting device 600 that facilitates reducing surface losses for quantum devices. In particular, FIGS. 6-7 illustrate a top view of device 600 and a cross-sectional view of device 600 taken along line B-B, respectively. As shown by FIGS. 6-7, device 600 comprises electrodes 620 and 630 formed on a surface 612 of a dielectric layer 610. Dielectric layer 610 can comprise any material having electrically insulating properties including, but not limited to, sapphire and diamond, as well as semiconductor elements, such as Si, SiGe, SiGeC, SiC, Ge alloys, GaAs, and the like, knowing that semiconductors can behave as insulators at operating temperatures of below 1 degree Kelvin. Electrodes 620 and/or 630 can comprise titanium nitride (TiN), aluminum (Al), niobium (Nb), rhenium (Re), tin (Sn), a non-superconductor, a superconductor, a ferromagnetic metal, or a combination thereof. Electrodes 620 and 630 can comprise a transmon when coupled to a tunneling junction (not shown) positioned on surface 612 in a gap 640 that intervenes between electrodes 620 and 630. In an embodiment, a transmon implemented using device 600 can be referred to as a thin dielectric transmon.

One aspect of device 600 that facilitate reducing surface losses involves reducing one or more dimensions of electrodes 620 and 630. For example, a comparison between FIG. 1 and FIG. 6 illustrates that electrode 630 comprises a length dimension 632 that is notably smaller than length dimension 132 of electrode 130. As another example, a width dimension 634 and/or a height dimension 636 of electrode 630 can also be reduced. One skilled in the art will recognize that by reducing one or more dimensions of electrodes 620 and 630 an associated capacitance provided by electrodes 620 and 630 can be reduced. Any such reduction in capacitance can negatively impact the performance of a transmon formed, in part, by electrodes 620 and 630.

As shown by FIG. 7, a thickness of dielectric layer 610 can be reduced to mitigate such reduction in capacitance. To that end, device 600 includes a recess 710 formed in a surface 612 of dielectric layer 610 that reduces a thickness of dielectric layer 610. In particular, recess 710 reduces the thickness of dielectric layer 610 from a thickness 720 external to a footprint of recess 710 to a thickness 730 within the footprint of recess 710. The thickness 730 can be less than thickness 720. The thickness 730 can intervene between electrode 630 and an electrode 650 positioned on a surface 614 of dielectric layer 610. Surface 612 and surface 614 can be opposing surfaces of dielectric layer 610. In an embodiment, thickness 730 can be between approximately 5 um and approximately 20 μm. Electrode 620 can be positioned with the footprint of recess 710. Electrode 630 can also be positioned within a footprint of another recess formed in surface 612 of dielectric layer 610. That reduction in the thickness of dielectric layer 610 can facilitate increasing an associated capacitance provided by electrodes 620 and 630 to a value that is substantially similar to a capacitance value provided by electrodes 120 and 130.

A reduction in surface losses would intuitively be expected on account of reducing a surface area of electrodes 620 and 630 through reducing the one or more dimensions of electrodes 620 and 630. However, reducing the thickness of dielectric layer 610 to facilitate increasing the associated capacitance provided by electrodes 620 and 630 can increase an amplitude of electric fields present at surface 612. In particular, that increase in electrical field amplitude present at surface 612 can involve translating some electrical field lines from within dielectric layer 610 to surface 612 through reducing the thickness of dielectric layer 610.

Figure 8:
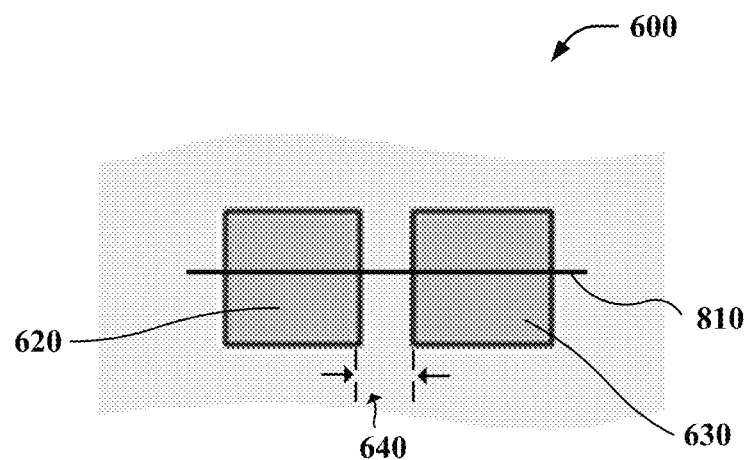
FIG. 8 illustrates a close-up view depicting a surface of the example, non-limiting device of FIG. 6, in accordance with one or more embodiments described herein.
Figure 9:
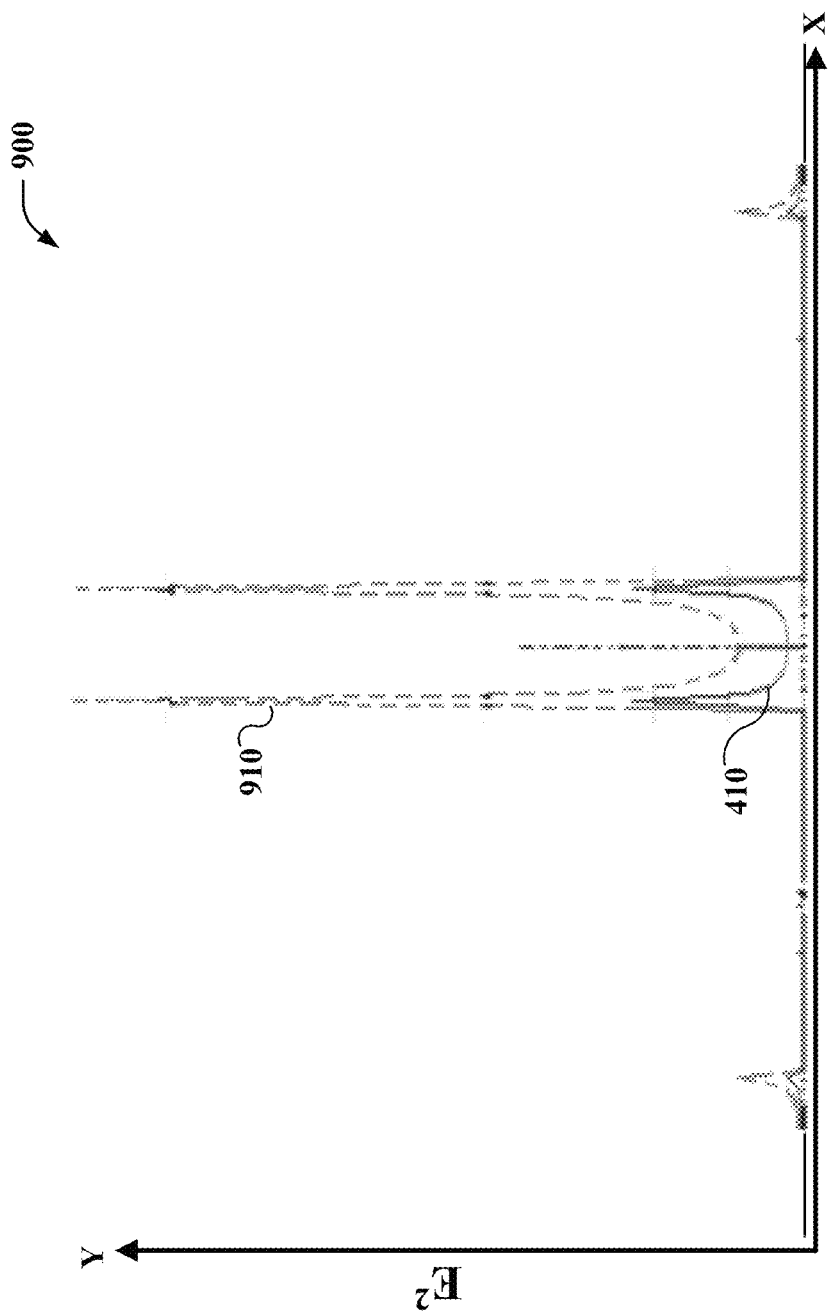
FIG. 9 illustrates an example, non-limiting graph depicting respective calculated profiles of a square of an electric field amplitude corresponding to the example, non-limiting devices of FIGS. 1 and 6, in accordance with one or more embodiments described herein.

FIG. 9 illustrates an example, non-limiting graph 900 depicting a calculated profile 910 of the square of the electric field amplitude (corresponding to a Y-axis of graph 900) plotted along line 810 of FIG. 8 (corresponding to an X-axis of graph 900). Line 810 of FIG. 8 can substantially correspond with line 310 of FIG. 3, and so the X-axis of graph 900 can substantially correspond with the X-axis of graph 400. As shown by FIG. 9, calculated profile 910 can be substantially larger than calculated profile 410 by nearly one order of magnitude. In some instances, calculated profile 910 can comprise an increase in square of electrical field amplitude relative to calculated profile 410 by a ratio that is substantially similar to a ratio by which the respective surface areas of electrodes 620 and 630 were reduced relative to electrodes 120 and 130. In such instances, any surface loss reduction expected by reducing the respective surface areas of electrodes 620 and 630 can be negated by the corresponding increase in electrical field amplitude.

Figure 10:
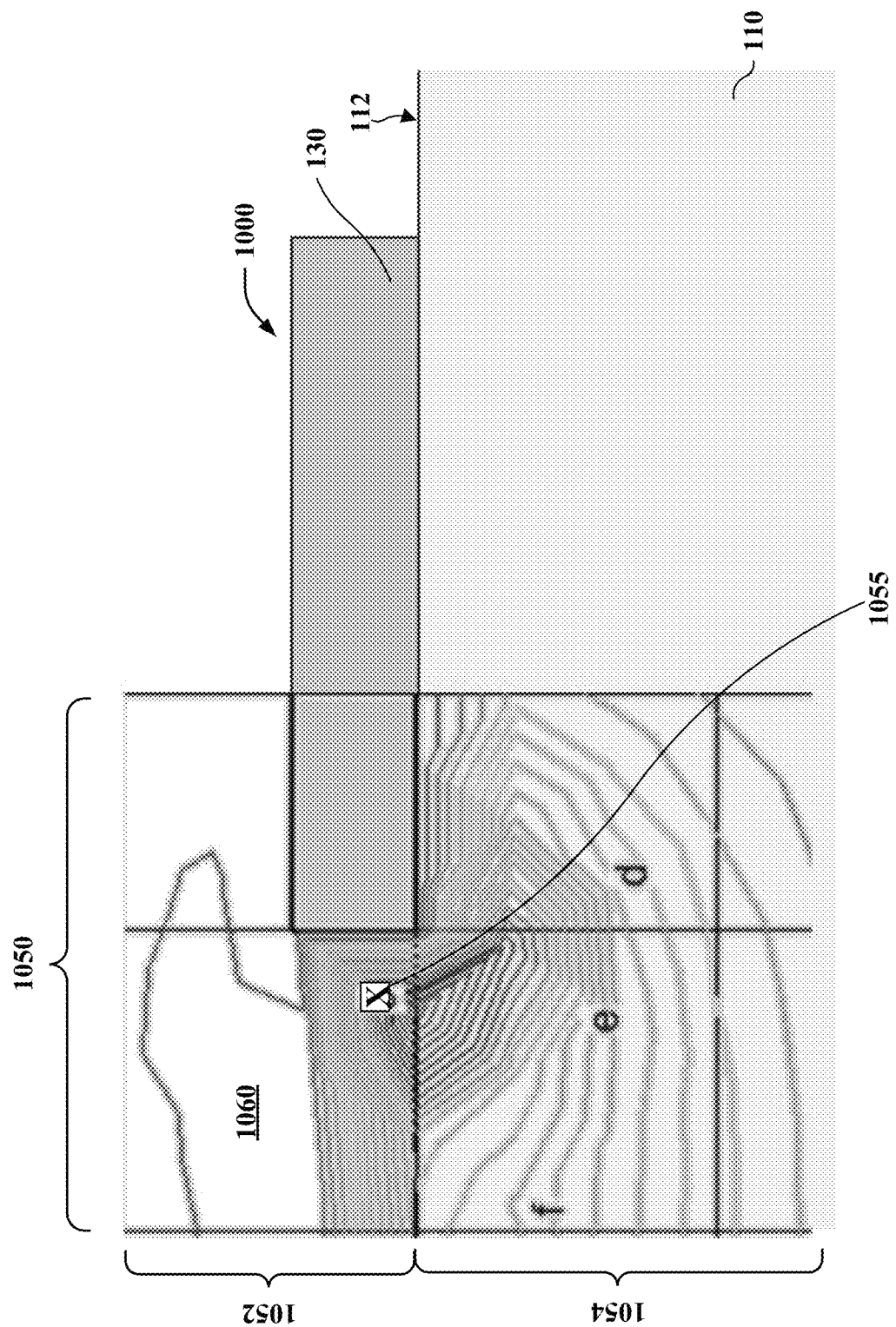
FIG. 10 illustrates a cross-sectional view depicting example, non-limiting energy density contours associated with the example, non-limiting device of FIG. 1, in accordance with one or more embodiments described herein.

FIG. 10 illustrates a cross-sectional view 1000 depicting example, non-limiting energy density contours 1050 associated with device 100 of FIGS. 1-3. The energy density contours 1050 of FIG. 10 can be derived as the magnitude of $\varepsilon E^2$ (the driving term for a lossy medium such as a TLS) at all points of the region. In an embodiment, the electrical field E can be calculated using a Finite-Element software package that can decompose the volume of interest into triangular elements. The Finite-Element software package can also calculate the electric field at each vortex of the elements. This electric field can result from applying a voltage to conductive electrodes (e.g., electrodes 620 and/or 630). As shown by FIG. 10, the energy density contours 1050 associated with device 100 comprise energy density contours 1052 located in a medium 1060 (e.g., air) positioned above surface 112 of dielectric layer 110 and energy density contours 1054 located within dielectric layer 110. The energy density contours 1052 can be associated with radiative losses of device 100. FIG. 10 further shows that the energy density contours 1050 includes a local maximum 1055 located within medium 1060 proximate to surface 112 that can provide an interface between dielectric layer 110 and medium 1060.

Figure 11:
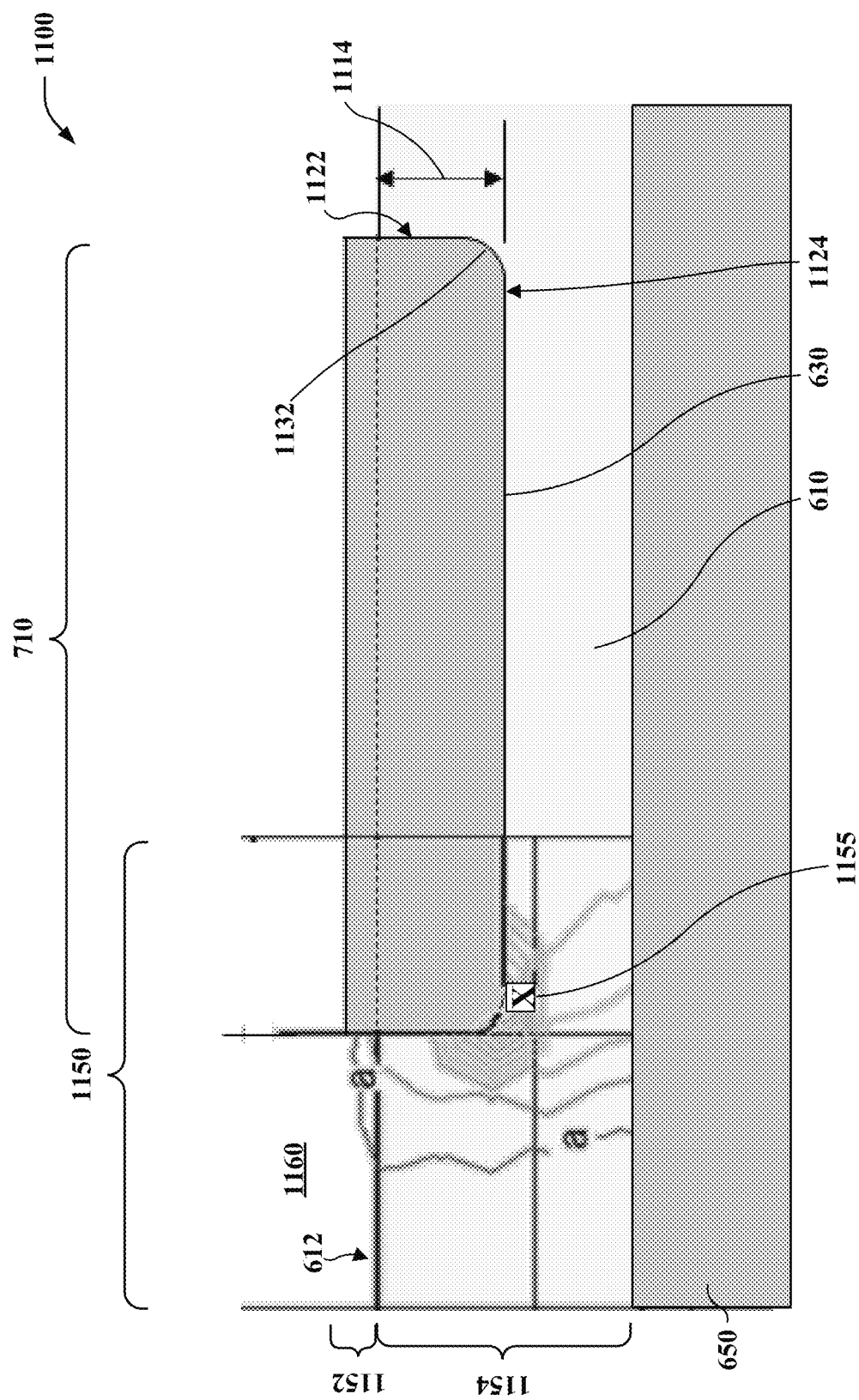
FIG. 11 illustrates a cross-sectional view depicting example, non-limiting energy density contours associated with the example, non-limiting device of FIG. 6 in accordance with one or more embodiments described herein.

FIG. 11 illustrates a cross-sectional view 1100 depicting example, non-limiting energy density contours 1150 associated with device 600 of FIGS. 6-9, in accordance with one or more embodiments described herein. The energy density contours 1150 of FIG. 11 can be derived in a similar manner to the energy density contours 1050 of FIG. 10. Similar to the energy density contours 1050 of FIG. 10, the energy density contours 1150 associated with device 600 comprise energy density contours 1152 located in a medium 1160 (e.g., air) positioned above surface 612 of dielectric layer 610 and energy density contours 1154 located within dielectric layer 610. However, unlike the energy density contours 1050 of FIG. 10, the energy density contours 1150 of FIG. 11 are predominantly located within dielectric layer 610. That is, the energy density contours 1154 located within dielectric layer 610 can substantially exceed the energy density contours 1152 located external to dielectric layer 610. As shown by FIG. 11, the energy density contours 1150 includes a local maximum 1155 located within dielectric layer 610 at a depth 1114 corresponding to a distance between a surface 612 of dielectric layer 610 and a recess surface 1124 of dielectric layer 610 within a footprint of recess 710. In an embodiment, depth 1114 can be, at least, 0.3 µm. The local maximum 1155 can be positioned within dielectric layer 610 between electrode 630 and electrode 650.

In FIG. 11, electrode 630 of device 600 includes rounded edges (e.g., rounded edge 1132) that interface with sidewalls 1122 of recess 710 and recess surface 1124 within the footprint of recess 710. In an embodiment, rounded edge 1132 can be a bottom corner of electrode 630 that is rounded by a radius r. As further shown by FIG. 11, the rounded edges can facilitate spreading and/or minimizing the peaks of energy density contours 1154 within dielectric layer 610. In some instances, the rounded edges of electrode 630 can especially facilitate spreading and/or minimizing the peaks of energy density contours 1154 within dielectric layer 610 proximate to a metal/dielectric interface associated with sidewalls 1122 and/or recess surface 1124.

Table 1 presents example reductions in surface loss that can be obtained by a thin dielectric transmon (e.g., a transmon implemented using device 600) compared to a standard transmon (e.g., a transmon implemented using device 100). In example Table 1, d (µm) can correspond to depth 1114 of FIG. 11. For this comparison, the standard transmon includes electrodes (e.g., electrodes 120 and/or 130 of FIG. 1) comprising a length dimension (e.g., length dimension 132) of 500 um and a width dimension (e.g., width dimension 134) of 60 µm. The standard transmon further includes a gap (e.g., gap 140) between the electrodes of 20 µm. The thin dielectric transmon includes electrodes (e.g., electrodes 620 and/or 630 of FIG. 6) comprising a length dimension (e.g., length dimension 632) of 70 µm and a width dimension (e.g., width dimension 634) of 60 µm. The thin dielectric transmon further includes a gap (e.g., gap 640) between the electrodes of 20 µm. The thin dielectric transmon also includes a thickness (e.g., thickness 730 of FIG. 7) of dielectric material between electrodes (e.g., electrodes 620 and/or 630) positioned on a surface (e.g., surface 612) of a dielectric layer and an electrode (e.g., electrode 650) positioned on an opposing surface (e.g., surface 614) of the dielectric layer. That thickness of the thin dielectric transmon can be maintained at 4.5 µm.

TABLE 1

| d (um) | Surface loss reduction |
|---|---|
| 0 | 1.1 x |
| 1 | 5.0 x |
| 2 | 7.5 x |
| 4 | 10.8 x |
| 8 | 16.5 x |

As shown by Table 1, some reduction in surface loss that can be obtained by the thin dielectric transmon relative to the standard transmon even without recessing the electrodes positioned on the surface of the dielectric layer. That is, the thin dielectric transmon can obtain 1.1× increase in surface loss reduction relative to the standard transmon even without forming a recess within the surface of the dielectric layer. Calculating surface loss values for the thin dielectric transmon and the standard transmon in Table 1 can involve an integration for each transmon. One integration can sum $\varepsilon E^2$ over a surface of a dielectric layer corresponding to the thin dielectric transmon and another integration can sum $\varepsilon E^2$ over a surface of a dielectric layer corresponding to the standard transmon. Table 1 can present a ratio of these 2 integrations. Table 1 further shows that the surface loss reduction obtained by the thin dielectric transmon can increase by an order of magnitude when those electrodes are positioned within a recess (e.g., recess 710) having a depth (e.g., depth 1114 of FIG. 11) of 4 µm. In this example, the surface loss reduction increased from 1.1 × to 10.8× relative to the standard transmon by increasing the depth of the recess within which the electrodes are positioned from 0 µm to 4 µm.

Table 2 illustrates that surface loss reductions can be obtained with a standard transmon by recessing electrodes of the standard transmon within a corresponding dielectric layer. Comparison in Table 2 is made between standard transmons only. For example, Table 2 shows that the standard transmon can obtain approximately a 3× increase in surface loss reduction by recessing the electrodes into the corresponding dielectric to a depth of 1 µm.

TABLE 2

| d (um) | Surface loss reduction |
|---|---|
| 0 | 1.0 x |
| 1 | 2.9 x |
| 2 | 3.3 x |
| 4 | 3.6 x |
| 8 | 3.8 x |

FIGS. 12-15 illustrate cross-sectional views of example, non-limiting devices with recessed electrodes, in accordance with one or more embodiments described herein. Each electrode depicted in FIGS. 12-15 can comprise TiN, Al, Nb, Re, Sn, a non-superconductor, a superconductor, a ferromagnetic metal, or a combination thereof. FIG. 12 illustrates an example, non-limiting device 1200 comprising an electrode 1230 positioned within the footprint of the recess 710 that is formed in surface 612 of dielectric layer 610. As shown by FIG. 12, a surface 1232 of electrode 1230 does not coincide with surface 612 of dielectric layer 610. Rather, electrode 1230 only interfaces with a portion 1224 of the sidewalls 1122 that define recess 710.

FIG. 13 illustrates an example, non-limiting device 1300 comprising an electrode 1330 positioned within the footprint of the recess 710 that is formed in surface 612 of dielectric layer 610. As shown by FIG. 13, electrode 1330 does not comprise a solid mass that fully occupies a volume of recess 710. Rather, electrode 1330 comprises a film that continuously extends between the sidewalls 1122 that define recess 710. The film comprising electrode 1330 extends beyond surface 612 of dielectric layer 610.

Device 1400 of FIG. 14 can comprise an example, non-limiting alternative embodiment of device 1300 of FIG. 13. Similar to device 1300, device 1400 includes an electrode 1430 that does not comprise a solid mass that fully occupies a volume of recess 710. Similar to electrode 1330 of device 1300, electrode 1430 comprises a film that continuously extends between the sidewalls 1122 that define recess 710. Unlike electrode 1330, electrode 1430 does not extend beyond surface 612 of dielectric layer 610. Rather, electrode 1430 partially extends up the sidewalls 1122 that define recess 710 such that electrode 1430 does not interface with a portion 1424 of the sidewalls 1122.

FIG. 15 illustrates an example, non-limiting device 1500 comprising a recess 1520 formed in dielectric layer 610. As shown by FIG. 15, recess 1520 is defined by sidewalls 1522 that undercut the surface 1612 of dielectric layer 610 in which recess 1520 is formed. Device 1500 further comprises an electrode 1530 positioned within recess 1520. Similar to electrodes 1330 and 1430 of FIGS. 13-14, respectively, electrode 1530 does not comprise a solid mass that fully occupies a volume of recess 1520. Instead, electrode 1530 comprises a film that continuously extends between the sidewalls 1522 that define recess 1520. Similar to electrode 1430 of FIG. 14, electrode 1530 partially extends up the sidewalls 1522 such that electrode 1530 does not interface with a portion 1524 of the sidewalls 1522.

FIGS. 16-27 illustrate an example, non-limiting multi-step fabrication sequence that can be implemented to fabricate one or more embodiments of the present disclosure described herein and/or illustrated in the figures. For example, the non-limiting multi-step fabrication sequence illustrated in FIGS. 16-27 can be implemented to fabricate a device that facilitates reducing surface losses for quantum devices such as device 600 of FIGS. 6-8.

FIG. 16 illustrates a cross-sectional view of an example, non-limiting device 1600 that can facilitate reducing surface losses for quantum devices, in accordance with one or more embodiments described herein. As shown in FIG. 16, device 1600 can comprise a substrate 1610. Substrate 1610 can comprise any material having mechanically rigid properties including, but not limited to, metals, glass, sapphire and diamond as well as semiconductor elements, such as Si, SiGe, SiGeC, SiC, Ge alloys, GaAs, and other materials having mechanically rigid properties. Device 1600 can further comprise an intermediate layer 1620 formed over substrate 1610. Intermediate layer 1620 can comprise any material with at least one material property that is distinct from a corresponding material property of substrate 1610. In an embodiment, the at least one material property can include: a mechanical property; a chemical property; an electrical property; or a combination thereof. In an embodiment, intermediate layer 1620 can have electrically insulating properties including, but not limited to, silicon dioxide ($SiO_2$), silicon nitride ($Si_3N_4$), hafnium oxide ($HfO_2$), aluminum oxide ($Al_2O_3$), and other materials having electrically insulating properties. In an embodiment, intermediate layer 1620 can be a buried oxide (BOX) layer. In an embodiment, the BOX layer can be grown thermally or can be obtained via ion implantation. In an embodiment, intermediate layer 1620 can be grown or formed via atomic layer deposition (ALD), plasma-enhanced chemical vapor deposition (PECVD), tetraethyl orthosilicate (TEOS), and the like. In an embodiment, intermediate layer 1620 can comprise any combination of a BOX layer and one or more dielectric layers grown or formed via ALD, PECVD, TEOS, and the like. Device 1600 can further comprise a dielectric layer 1630 formed over intermediate layer 1620. Dielectric layer 1630 can comprise any material having electrically insulating properties including, but not limited to, sapphire and diamond, as well as semiconductor elements, such as Si, SiGe, SiGeC, SiC, Ge alloys, GaAs, and the like knowing that semiconductors can behave as insulators at operating temperatures of below 1 degree Kelvin. In an embodiment, substrate 1610, intermediate layer 1620, and dielectric layer 1630 can form a silicon on insulator (SOI) wafer.

FIG. 17 illustrates a cross-sectional view of the example, non-limiting device of FIG. 16 after growing or forming a dielectric layer 1740, in accordance with one or more embodiments described herein. Device 1700 can comprise an example, non-limiting alternative embodiment of device 1600 made growing or forming a dielectric layer 1740 on dielectric layer 1630. Dielectric layer 1740 can comprise any material having electrically insulating properties including, but not limited to, sapphire and diamond, as well as semiconductor elements, such as Si, SiGe, SiGeC, SiC, Ge alloys, GaAs, and the like knowing that semiconductors can behave as insulators at operating temperatures of below 1 degree Kelvin. In an embodiment, dielectric layer 1740 can comprise a dielectric loss tangent of less than $10^{-6}$ or ideally less than $10^{-7}$. In an embodiment, dielectric layer 1740 can comprise a defect density of less than one part in $10^{10}$ (e.g., less than one defect per $10^{10}$ atom). Example defects associated with the defect density can include vacancies, self-interstitials, anti-sites, unintentional impurities, and the like. In an embodiment, dielectric layer 1740 can comprise a resistivity of at least $10^4$ Ohm·cm. In an embodiment, dielectric layer 1740 can be an epitaxially grown layer formed using an epitaxial growth process, such as metal-organic vapor phase epitaxy (MOVPE), vapor-phase epitaxy (VPE), molecular-beam epitaxy (MBE), liquid-phase epitaxy (LPE), or other epitaxial growth processes. In an embodiment, dielectric layer 1740 can comprise a thickness (e.g., height) of approximately 1 to 10 micrometers (µm). In an embodiment, dielectric layer 1740 can be omitted from one or more of the devices depicted in FIGS. 17-27 when dielectric layer 1630 comprises a defect density of less than 1000 per square centimeter ($cm^2$). In an embodiment, dielectric layer 1740 can be omitted from one or more of the devices depicted in FIGS. 17-27 when dielectric layer 1630 comprises a defect density of less than 1000 per $cm^2$ and a resistivity of at least 1000 Ohm·cm. In an embodiment, dielectric layer 1740 can be omitted from one or more of the devices depicted in FIGS. 17-27 when dielectric layer 1630 comprises a defect density of less than 1000 per $cm^2$ and a thickness of at least 10 µm.

FIG. 18 illustrates a cross-sectional view of the example, non-limiting device of FIG. 17 after depositing one or more metal layers 1850, in accordance with one or more embodiments described herein. Device 1800 can comprise an example, non-limiting alternative embodiment of device 1700 formed by depositing one or more metal layers 1850 on dielectric layer 1740. The one or more metal layers 1850 can comprise TiN, Al, Nb, Re, Sn, a non-superconductor, a superconductor, a ferromagnetic metal, or a combination thereof. In an embodiment, the one or more metal layers 1850 can be deposited on dielectric layer 1740 via physical vapor deposition (PVD), chemical vapor deposition (CVD), atomic layer deposition (ALD), or another metallization process. In an embodiment, at least one top adhesion-promoting layer (e.g., a $SiO_2$ layer and/or a glass layer) can be formed over the one or more metal layers 1850. In an embodiment, the one or more metal layers 1850 can comprise electrode 650 of FIG. 8.

FIG. 19 illustrates a cross-sectional view of the example, non-limiting device of FIG. 18 after inverting or flipping an orientation of device 1800, in accordance with one or more embodiments described herein. With reference to FIG. 18, device 1800 includes substrate 1610 and intermediate layer 1620 arranged in an orientation 1805. After inverting or flipping orientation 1805 of device 1800, substrate 1610 and intermediate layer 1620 in device 1900 can be arranged in an orientation 1905 that opposes orientation 1805, as shown by FIG. 19.

FIG. 20 illustrates a cross-sectional view of the example, non-limiting device of FIG. 19 after bonding a handle layer 2060 to the one or more metal layers 1850, in accordance with one or more embodiments described herein. Device 2000 can comprise an example, non-limiting alternative embodiment of device 1900 formed by bonding handle layer 2060 to the one or more metal layers 1850. Handle layer 2060 can be any mechanically rigid material, such as a metal, dielectric material, or other mechanically rigid materials. In an embodiment, handle layer 2060 can be a carrier wafer comprising any material having semiconductor properties including, but not limited to, diamond, Si, SiGe, SiGeC, SiC, Ge alloys, and the like. Handle layer 2060 can be bonded to the one or more metal layers 1850 via diffusion bonding, adhesive bonding, fusion bonding, or other semiconductor bonding techniques.

FIG. 21 illustrates a cross-sectional view of the example, non-limiting device of FIG. 20 after removing substrate 1610, in accordance with one or more embodiments described herein. Device 2100 can comprise an example, non-limiting alternative embodiment of device 2000 formed by removing substrate 1610. Substrate 1610 can be removed via a chemical-mechanical-polishing (CMP) process that involves applying a combination of chemical and mechanical forces to substrate 1610. Intermediate layer 1620 can serve as a stop layer for the CMP process to facilitate isolating dielectric layer 1630 from the combination of chemical and mechanical forces involved in the CMP process. In an embodiment, intermediate layer 1620 can comprise a thickness (e.g., height) of at least 1 μm to facilitate accuracy and/or reliability of the CMP process. Of note, available SOI wafers generally comprise an insulator layer of at least 1 μm.

FIG. 22 illustrates a cross-sectional view of the example, non-limiting device of FIG. 21 after removing intermediate layer 1620, in accordance with one or more embodiments described herein. Device 2200 can comprise an example, non-limiting alternative embodiment of device 2100 formed by removing intermediate layer 1620. Intermediate layer 1620 can be removed via a dry etching process, a wet etching process, or other etching processes.

FIG. 23 illustrates a cross-sectional view of the example, non-limiting device of FIG. 22 after forming a recess 2370 in dielectric layers 1630 and/or 1740, in accordance with one or more embodiments described herein. Device 2300 can comprise an example, non-limiting alternative embodiment of device 2200 created by forming a recess 2370 in dielectric layers 1630 and/or 1740. Dielectric layers 1630 and/or 1740 can be selectively etched to form recess 2370. As shown by FIG. 23, recess 2370 can reduce a thickness of dielectric layer 1740 from a thickness 2342 external to a footprint of recess 2370 to a thickness 2344 within the footprint of recess 2370. In an embodiment, recess 2370 can comprise recess 710 of FIG. 7. In an embodiment, handle layer 2060 can comprise a thickness (e.g., height) of approximately 750 μm to provide structural support to dielectric layer 1740. In this embodiment, thickness 2344 of dielectric layer 1740 can compromise a structural integrity of dielectric layer 1740 proximate to recess 2370.

Figure 24:
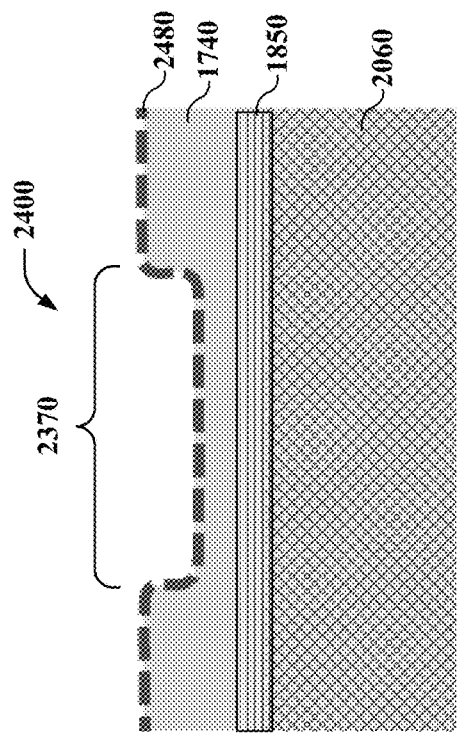
FIG. 24 illustrates a cross-sectional view of the example, non-limiting device of FIG. 23 after application of an oxidation process, in accordance with one or more embodiments described herein.

FIG. 24 illustrates a cross-sectional view of the example, non-limiting device of FIG. 23 after application of an oxidation process, in accordance with one or more embodiments described herein. Device 2400 can comprise an example, non-limiting alternative embodiment of device 2300 created after the oxidation process consumes dielectric layer 1630 and/or a portion of dielectric layer 1740. Application of the oxidation process (e.g., thermal oxidation and/or electrochemical oxidation) can consume dielectric layer 1630 and/or a portion of dielectric 1740 by converting dielectric material corresponding to dielectric layers 1630 and/or 1740 to an oxide layer 2480.

Figure 25:
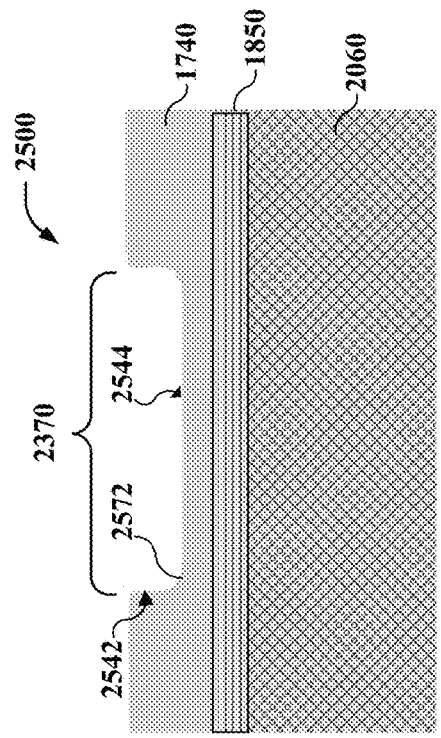
FIG. 25 illustrates a cross-sectional view of the example, non-limiting device of FIG. 24 after removing an oxide layer, in accordance with one or more embodiments described herein.

FIG. 25 illustrates a cross-sectional view of the example, non-limiting device of FIG. 24 after removing oxide layer 2480, in accordance with one or more embodiments described herein. Device 2500 can comprise an example, non-limiting alternative embodiment of device 2400 created after removing oxide layer 2480. Oxide layer 2480 can be removed via a dry etching process, a wet etching process, or other etching processes. As shown by FIG. 25, application of the oxidation process and removal of the resulting oxide layer 2480 can form a rounding radius 2572 between sidewalls 2542 of recess 2370 and a recess surface 2544 of dielectric layer 1740 within the footprint of recess 2370. In an embodiment, rounding radius 2572 can comprise rounding radius 1132 of FIG. 11.

Figure 26:
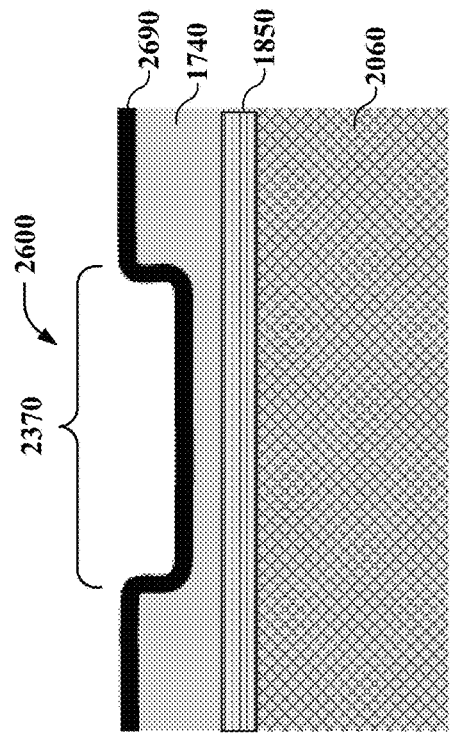
FIG. 26 illustrates a cross-sectional view of the example, non-limiting device of FIG. 25 after depositing one or more metal layers, in accordance with one or more embodiments described herein.

FIG. 26 illustrates a cross-sectional view of the example, non-limiting device of FIG. 25 after depositing one or more metal layers 2690. Device 2600 can comprise an example, non-limiting alternative embodiment of device 2500 formed by depositing one or more metal layers 2690 on dielectric layer 1740. The one or more metal layers 2690 can comprise TiN, Al, Nb, Re, Sn, a non-superconductor, a superconductor, a ferromagnetic metal, or a combination thereof. In an embodiment, the one or more metal layers 2690 can be deposited on dielectric layer 1740 via PVD, CVD, ALD, or another metallization process.

Figure 27:
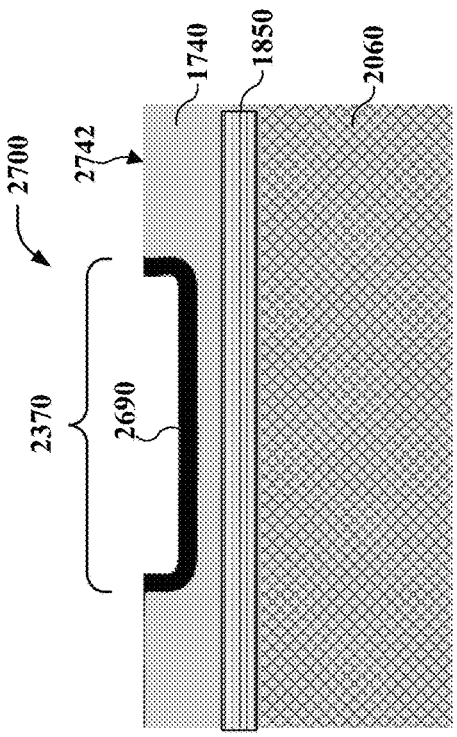
FIG. 27 illustrates a cross-sectional view of the example, non-limiting device of FIG. 26 after removing portions of the one or more metal layers external to the recess, in accordance with one or more embodiments described herein.

FIG. 27 illustrates a cross-sectional view of the example, non-limiting device of FIG. 26 after removing portions of the one or more metal layers 2690 external to recess 2370, in accordance with one or more embodiments described herein. Device 2700 can comprise an example, non-limiting alternative embodiment of device 2600 created by retaining portions of the one or more metal layers 2690 within recess 2370. The portions of the one or more metal layers 2690 external to recess 2370 can be removed via a CMP process that involves applying a combination of chemical and mechanical forces to the one or more metal layers 2690. Dielectric layer 1740 can serve as a stop layer for the CMP process to facilitate retaining the portions of the one or more metal layers 2690 within recess 2370. In an embodiment, the retained portions of the one or more metal layers 2690 within recess 2370 can form an electrode (e.g., electrodes 620 and/or 630 of FIGS. 6-8). In an embodiment, the CMP process can be fine-tuned for polish uniformity using fillerpatterns in regions that are otherwise bare of patterned components. In an embodiment, a photoresist can be applied to device 2700 using a spin coat technique to facilitate additional lithography steps. In an embodiment, a surface uniformity of dielectric layer 1740 following the CMP process can be insufficient to support application of a photoresist using a spin coat technique. In this embodiment, a photoresist (e.g., polymethyl methacrylate (PMMA) and/or methyl methacrylate (MMA)) can be sprayed on device 2700.

Figure 28:
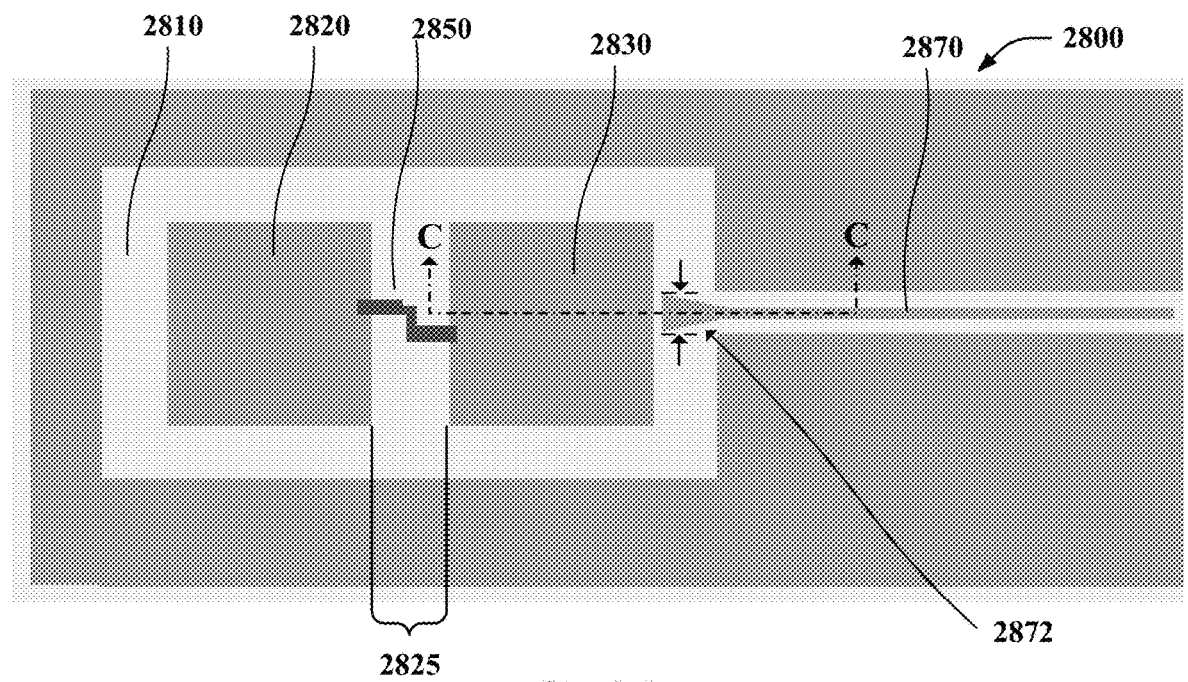
FIG. 28 illustrates a top view of an example, non-limiting device that can facilitate reducing surface losses for quantum devices, in accordance with one or more embodiments described herein.
Figure 29:
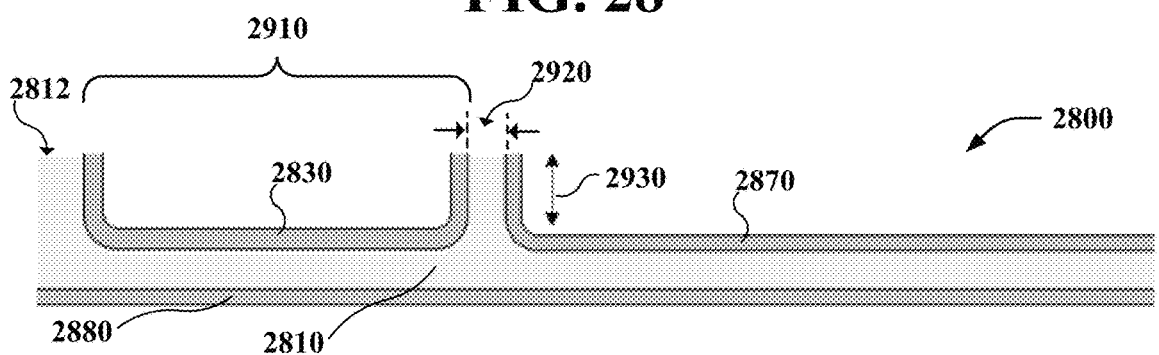
FIG. 29 illustrates a cross-sectional view of the example, non-limiting device of FIG. 28 taken along line C-C, in accordance with one or more embodiments described herein.

FIGS. 28-29 illustrate an example, non-limiting device 2800 that facilitates reducing surface losses for quantum devices. In particular, FIGS. 28-29 illustrate a top view of device 2800 and a cross-sectional view of device 2800 taken along line C-C, respectively. As shown by FIGS. 28-29, device 2800 can comprise an electrode 2830 positioned within a footprint of a recess 2910 formed in a surface 2812 of a dielectric layer 2810. Device 2800 can further comprise an electrode 2820 positioned on surface 2812. Similar to electrode 2830, electrode 2820 can positioned within a footprint of another recess (not shown) formed in surface 2812.

With reference to FIG. 29, device 2800 can further comprise an electrode 2880 that can be positioned on a surface of dielectric layer 2810 that opposes surface 2812. Electrode 2880 can be electrically isolated from electrodes 2820 and/or 2830 by dielectric layer 2810. In device 2800, electrodes 2820 and 2880 can form a first capacitance (or capacitor). Electrodes 2830 and 2880 can also form a second capacitance (or capacitor) that is in series with the first capacitance in device 2800. Dielectric layer 2810 can comprise any material having electrically insulating properties including, but not limited to, sapphire and diamond, as well as semiconductor elements, such as Si, SiGe, SiGeC, SiC, Ge alloys, GaAs, and the like, knowing that semiconductors can behave as insulators at operating temperatures of below 1 degree Kelvin. Electrodes 2820, 2830, and/or 2880 can comprise TiN, Al, Nb, Re, Sn, a non-superconductor, a superconductor, a ferromagnetic metal, or a combination thereof.

As shown by FIG. 28, a gap 2825 can intervene between electrodes 2820 and 2830 in device 2800. Electrode 2820 can be coupled to a Josephson junction 2850 positioned in gap 2825 and electrode 2830 can be coupled to the Josephson junction 2850 to form a qubit (e.g., a transmon). Device 2800 can further comprise a bus 2870 that couples the qubit with an external device (e.g., a readout circuit) via a gap 2920. In an embodiment, bus 2870 can comprise a readout resonator. In an embodiment, 2.2 femtofarads (fF) of coupling capacitance can exist between bus 2870 and electrode 2830 when the gap 2920 is 0.5 µm and bus 2870 comprises a width dimension 2872 of 10 µm and a thickness dimension 2930 of 1 µm.

Figure 30:
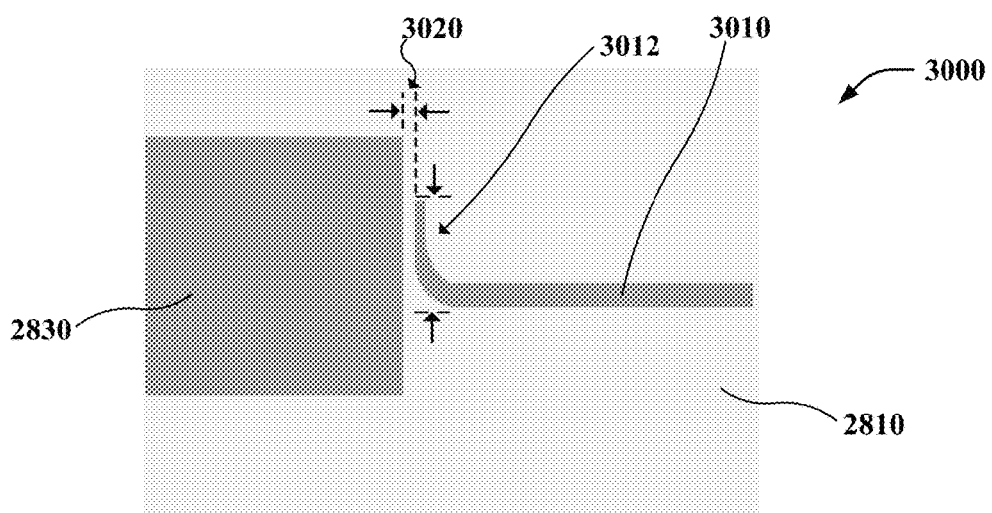
FIG. 30 illustrates a top view of another example, non-limiting device that can facilitate reducing surface losses for quantum devices, in accordance with one or more embodiments described herein.

Device 3000 of FIG. 30 can comprise an example, non-limiting alternative embodiment of device 2800 of FIGS. 28-29. Similar to device 2800 of FIGS. 28-29, device 3000 can comprise a bus 3010 that couples the qubit comprising electrode 2830 with an external device (e.g., a readout circuit) via a gap 3020. In an embodiment, 1 to 10 fF of coupling capacitance can exist between bus 3010 and electrode 2830 when the gap 3020 is 1 µm and bus 3010 comprises a coupling length dimension 3012 from 20 to 50 µm and a thickness dimension (not shown) from 0.5 to 1 µm.

FIGS. 31-35 illustrate an example, non-limiting device 3100 that can facilitate cross talk reduction and/or interqubit decoupling, in accordance with one or more embodiments described herein. In particular, FIG. 31 illustrates a top view of device 3100, FIGS. 32-33 illustrate cross-sectional views of device 3100 taken along line D-D, and FIGS. 34-35 illustrate cross-sectional views of device 3100 taken along line E-E, respectively. With reference to FIG. 31, device 3100 can comprise a shielding structure 3110 and a via structure 3120. As shown by FIGS. 32-35, shielding structure 3110 and/or via structure 3120 can electrically couple conductive elements positioned on opposing surfaces of dielectric layer 2810. For example, shielding structure 3110 and/or via structure 3120 can electrically couple a conductive element 3160 positioned on surface 2812 of dielectric layer 2810 with electrode 2880.

To that end, shielding structure 3110 and via structure 3120 can comprise sidewalls 3220 and 3420, respectively, that can provide electrically conductive paths between conductive element 3160 and electrode 2880. Sidewalls 3220 and/or 3420 can comprise TiN, Al, Nb, Re, Sn, a non-superconductor, a superconductor, a ferromagnetic metal, or a combination thereof. By providing electrically conductive paths between conductive element 3160 and electrode 2880, shielding structure 3110 and/or via structure 3120 can facilitate quantum hardware scalability. For example, shielding structure 3110 and/or via structure 3120 can implement electrical connections between different layers of a multi-layer quantum device that can involve increasingly dense levels of connectivity. A comparison between FIGS. 32 and 33 illustrates that a volume of shielding structure 3110 defined by sidewalls 3220 can be filled with a conductive material 3230 as seen in FIG. 32 or that volume can be left empty as seen in FIG. 33. A comparison between FIGS. 34 and 35 illustrates that a volume of via structure 3120 defined by sidewalls 3420 can be filled with a conductive material 3430 as seen in FIG. 34 or that volume can be left empty as seen in FIG. 35. In an embodiment, conductive material 3230 and/or 3430 can comprise TiN, Al, Nb, Re, Sn, a non-superconductor, a superconductor, a ferromagnetic metal, or a combination thereof.

Another aspect of shielding structure 3110 involves interqubit crosstalk. As discussed above, Josephson junction 2850 can couple with electrodes 2820, 2830, and 2880 to form a qubit. Shielding structure 3110 can intervene between that qubit and another qubit (not shown) positioned external to shielding structure 3110. In FIG. 31, shielding structure 3110 is depicted as substantially circumscribing the qubit comprising Josephson junction 2850. As such, the sidewalls 3220 of shielding structure 3110 can form a trench-like structure that substantially circumscribes the qubit comprising Josephson junction 2850 to mitigate lateral electric fields generated by that qubit. In doing so, shielding structure 3110 can facilitate crosstalk reduction and/or decoupling the qubit comprising Josephson junction 2850 and the other qubit (not shown) positioned external to shielding structure 3110. In an embodiment, the sidewalls 3220 of shielding structure 3110 can be analogous to a curtain that substantially circumscribes the qubit comprising Josephson junction 2850 to the extent that sidewalls 3220 extend between conductive element 3160 and electrode 2880. In an embodiment, shielding structure 3110 can be analogous to a moat with conducting or superconducting sidewalls that substantially circumscribes the qubit comprising Josephson junction 2850 to the extent that the sidewalls 3220 of shielding structure 3110 substantially circumscribe the qubit comprising Josephson junction 2850. In an embodiment, conductive element 3160 can be a ground plane that provides a ground potential.

Figure 36:
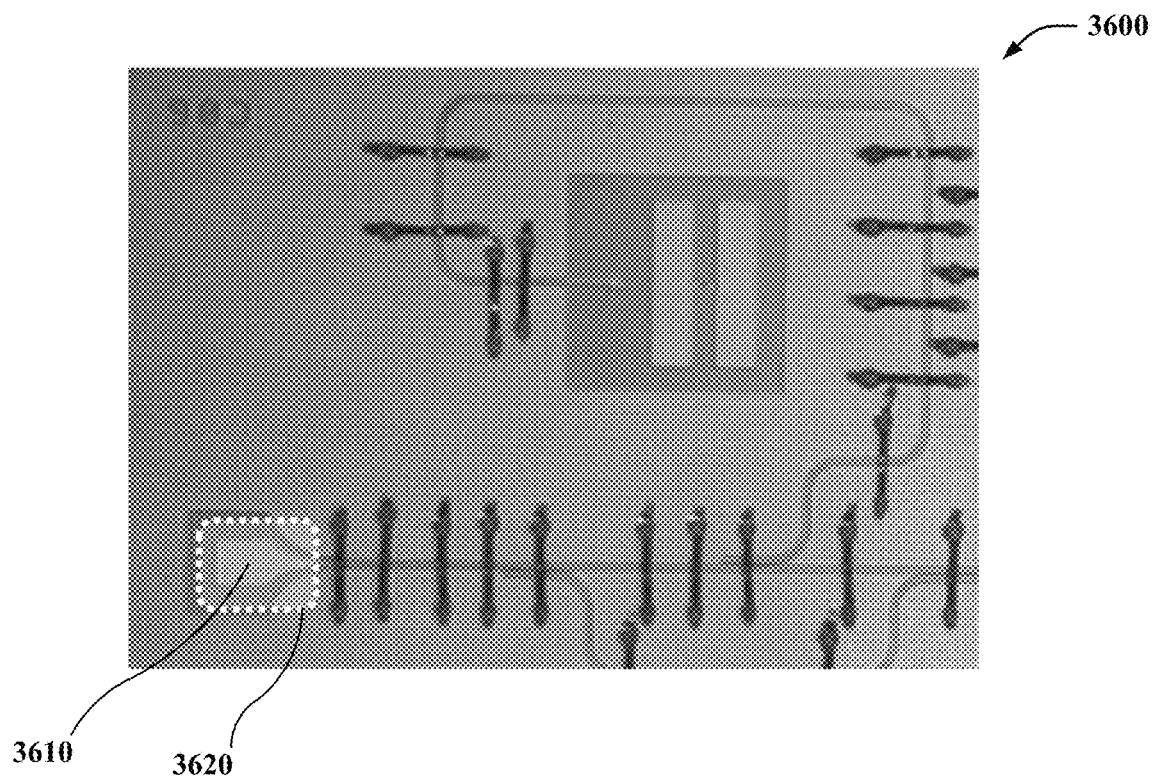
FIG. 36 illustrates an example, non-limiting device that can facilitate impedance matching, in accordance with one or more embodiments described herein.

FIG. 36 illustrates an example, non-limiting device 3600 that can facilitate impedance matching, in accordance with one or more embodiments described herein. As shown by FIG. 36, device 3600 includes a bump pad 3610 positioned on a surface of a dielectric layer. Bump pad 3610 can facilitate coupling device 3600 with an external device (e.g., a readout circuit). Device 3600 can further comprise an electrode (not shown) positioned on an opposing surface of the dielectric layer. For example, device 3600 can comprise an electrode such as electrode 2880 of FIG. 29. To facilitate impedance matching between device 3600 and the external device, a portion of that electrode within an area 3620 underlying bump pad 3610 can be removed.

Figure 37:
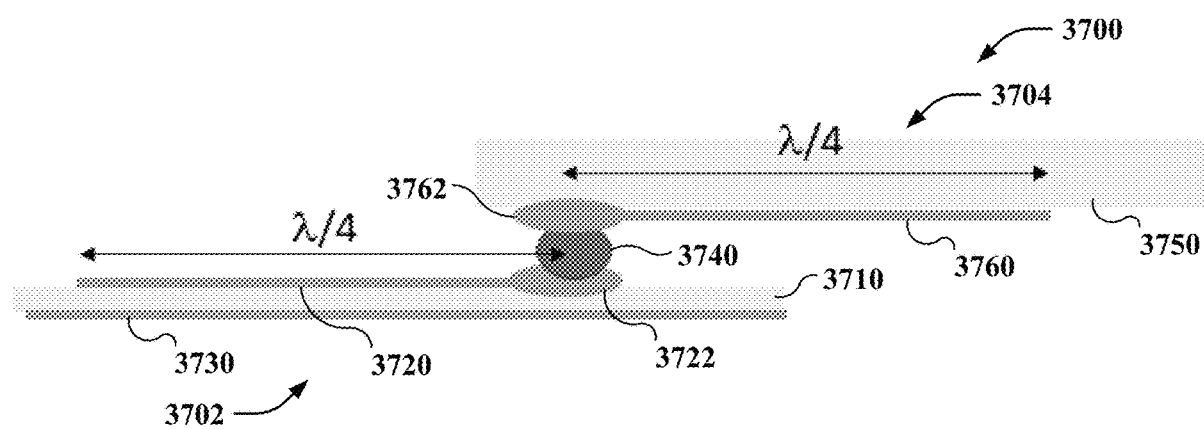
FIG. 37 illustrates another example, non-limiting device that can facilitate impedance matching, in accordance with one or more embodiments described herein.

FIG. 37 illustrates another example, non-limiting device 3700 that can facilitate impedance matching, in accordance with one or more embodiments described herein. As shown by FIG. 37, device 3700 includes an element 3702 that comprises electrodes 3720 and 3730 that are positioned on opposing surfaces of dielectric layer 3710. Device 3700 further includes an element 3704 that comprises an electrode 3760 that is positioned on a surface of dielectric layer 3750. Elements 3702 and 3704 can collectively form a half wavelength (λ/2) resonator structure. Elements 3702 and 3704 can be electrically coupled via solder 3740 that couples a bump pad 3722 of electrode 3720 with a bump pad 3762 of electrode 3760. As shown by FIG. 37, electrodes 3720 and 3760 can be configured as quarter wavelength (λ/4) resonator sub-structures to facilitate impedance matching.

Figure 38:
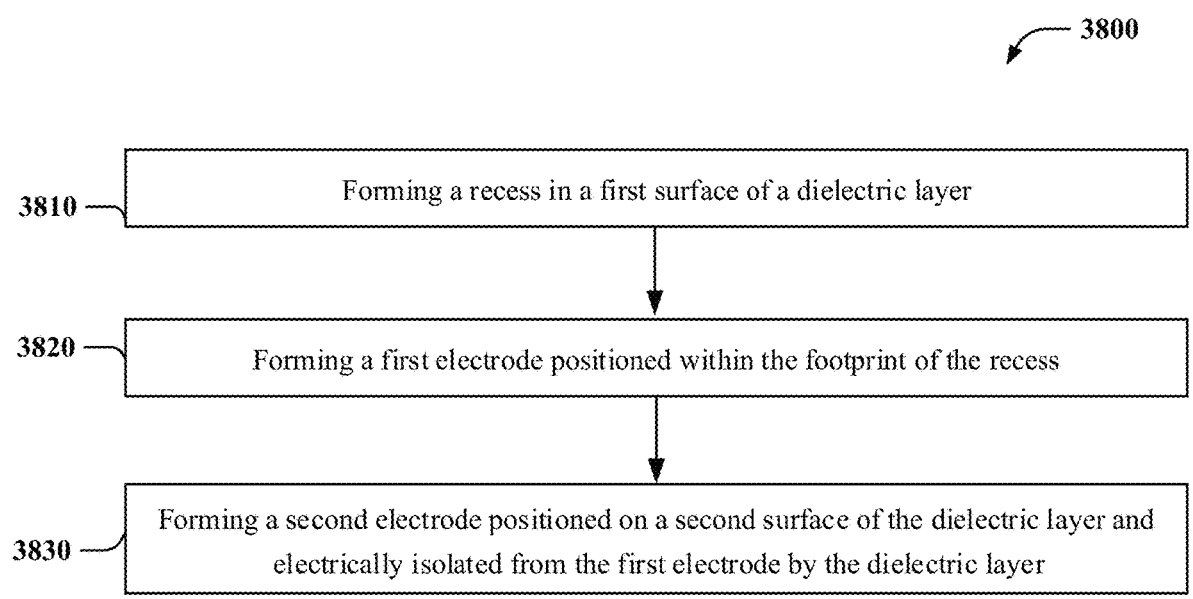
FIG. 38 illustrates a flow diagram of an example, non-limiting method that can facilitate reducing surface losses for quantum devices, in accordance with one or more embodiments described herein.

FIG. 38 illustrates a flow diagram of an example, non-limiting method 3800 that can facilitate reducing surface losses for quantum devices, in accordance with one or more embodiments described herein. Repetitive description of like elements employed in other embodiments described herein is omitted for sake of brevity. At 3810, the method 3800 can comprise forming a recess (e.g., recess 710 of FIG. 7) in a first surface of a dielectric layer (e.g., dielectric layer 610 of FIG. 6). The recess can reduce a thickness of the dielectric layer from a first thickness external to a footprint of the recess to a second thickness within the footprint of the recess. The second thickness can be less than the first thickness. At 3820, the method 3800 can further comprise forming a first electrode (e.g., electrode 630 of FIG. 6) positioned within the footprint of the recess. At 3830, the method 3800 can further comprise forming a second electrode (e.g., electrode 650 of FIG. 7) positioned on a second surface of the dielectric layer and electrically isolated from the first electrode by the dielectric layer. The first surface and the second surface can be positioned on opposing surfaces of the dielectric layer.

In an embodiment, the method 3800 can further comprise forming a Josephson junction (e.g., Josephson junction 2850 of FIG. 28) that is coupled with the first electrode and positioned on the first surface of the dielectric layer in a gap (e.g., gap 2825 of FIG. 28) that intervenes between the first electrode and a third electrode (e.g., electrode 2820). In an embodiment, the first electrode and the second electrode can form a first capacitance. In an embodiment, the second electrode and the third electrode can form a second capacitance. In an embodiment, the second capacitance can be in series with the first capacitance. In an embodiment, the second electrode can be formed prior to forming the first electrode. In an embodiment, the method 3800 can further comprise bonding a handle layer (e.g., handle layer 2060 of FIGS. 20-27) to the second electrode to provide structural support to the dielectric layer. In this embodiment, the second electrode can intervene between the dielectric layer and the handle layer.

In an embodiment, the method 3800 can further comprise oxidizing the surface of the dielectric layer to form a rounding radius (e.g., rounding radius 1132 of FIG. 11) between sidewalls of the recess and a recess surface of the dielectric layer within the footprint of the recess. In an embodiment, the method 3800 can further comprise forming a shielding structure (e.g., shielding structure 3110 of FIG. 31) positioned between the first electrode and a first qubit that is adjacent to the first electrode. The shielding structure can facilitate cross talk reduction. In this embodiment, the shielding structure can electrically couple the second electrode with a conductive element (e.g., conductive element 2860) positioned on the first surface that provides a ground potential. In an embodiment, the first electrode and the second electrode can comprise a second qubit. In this embodiment, the shielding structure can further facilitate decoupling the second qubit and the first qubit.

Figure 39:
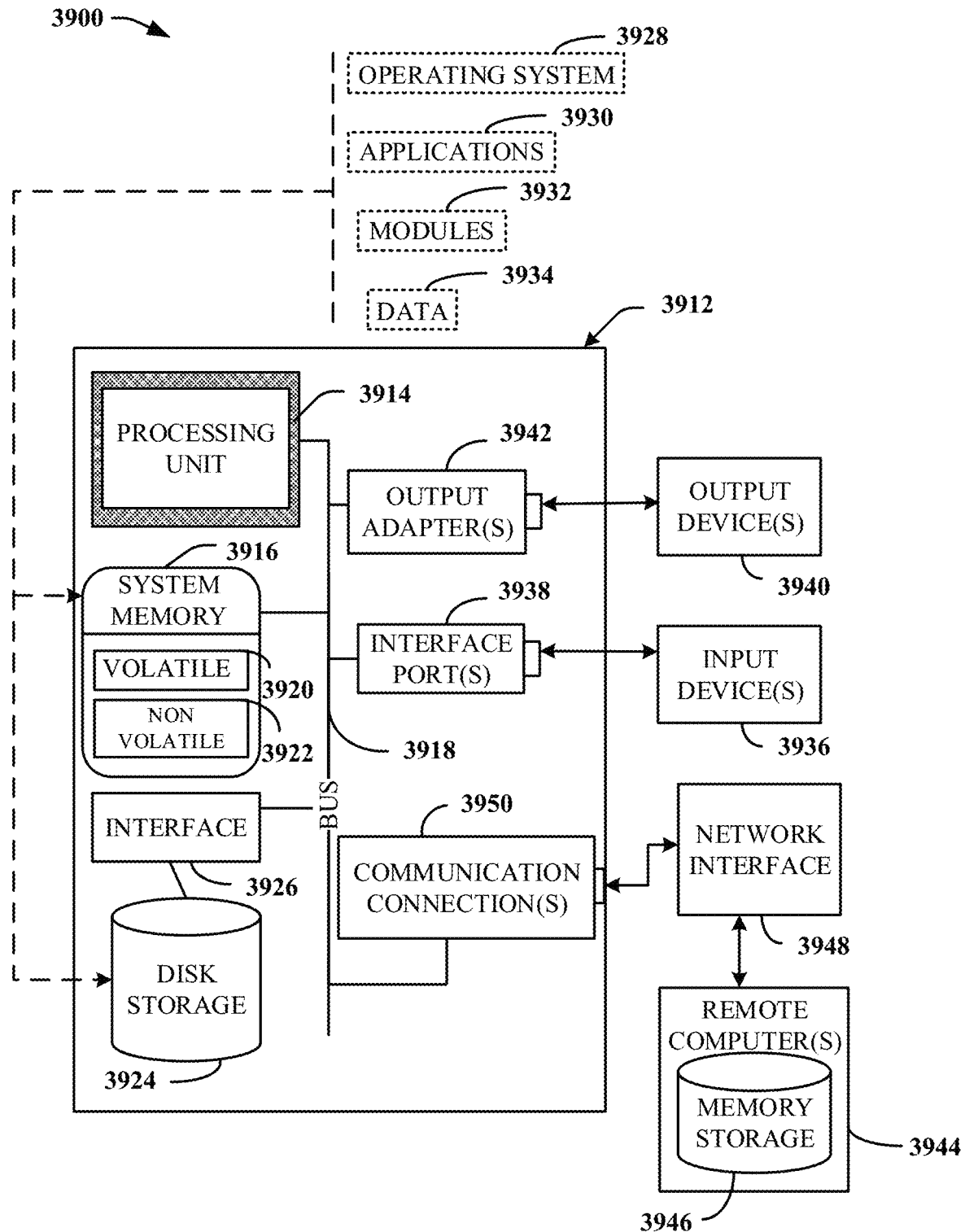
FIG. 39 illustrates a block diagram of an example, non-limiting operating environment in which one or more embodiments described herein can be facilitated.

In order to provide a context for the various aspects of the disclosed subject matter, FIG. 39 as well as the following discussion are intended to provide a general description of a suitable environment in which the various aspects of the disclosed subject matter can be implemented. FIG. 39 illustrates a suitable operating environment 3900 for implementing various aspects of this disclosure can also include a computer 3912. The computer 3912 can also include a processing unit 3914, a system memory 3916, and a system bus 3918. The system bus 3918 couples system components including, but not limited to, the system memory 3916 to the processing unit 3914. The processing unit 3914 can be any of various available processors. Dual microprocessors and other multiprocessor architectures also can be employed as the processing unit 3914. The system bus 3918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1094), and Small Computer Systems Interface (SCSI). The system memory 3916 can also include volatile memory 3920 and nonvolatile memory 3922. The basic input/output system (BIOS), containing the basic routines to transfer information between elements within the computer 3912, such as during start-up, is stored in nonvolatile memory 3922. By way of illustration, and not limitation, nonvolatile memory 3922 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 3920 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 3912 can also include removable/non-removable, volatile/non-volatile computer storage media. FIG. 39 illustrates, for example, a disk storage 3924. Disk storage 3924 can also include, but is not limited to, devices like a magnetic disk drive, floppy disk drive, tape drive, Jaz drive, Zip drive, LS-100 drive, flash memory card, or memory stick. The disk storage 3924 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 3924 to the system bus 3918, a removable or non-removable interface is typically used, such as interface 3926. FIG. 39 also depicts software that acts as an intermediary between users and the basic computer resources described in the suitable operating environment 3900. Such software can also include, for example, an operating system 3928. Operating system 3928, which can be stored on disk storage 3924, acts to control and allocate resources of the computer 3912. System applications 3930 take advantage of the management of resources by operating system 3928 through program modules 3932 and program data 3934, e.g., stored either in system memory 3916 or on disk storage 3924. It is to be appreciated that this disclosure can be implemented with various operating systems or combinations of operating systems. A user enters commands or information into the computer 3912 through input device(s) 3936. Input devices 3936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 3914 through the system bus 3918 via interface port(s) 3938. Interface port(s) 3938 include, for example, a serial port, a parallel port, a game port, and a universal serial bus (USB). Output device(s) 3940 use some of the same type of ports as input device(s) 3936. Thus, for example, a USB port can be used to provide input to computer 3912, and to output information from computer 3912 to an output device 3940. Output adapter 3942 is provided to illustrate that there are some output devices 3940 like monitors, speakers, and printers, among other output devices 3940, which require special adapters. The output adapters 3942 include, by way of illustration and not limitation, video and sound cards that provide a means of connection between the output device 3940 and the system bus 3918. It can be noted that other devices and/or systems of devices provide both input and output capabilities such as remote computer(s) 3944.

Computer 3912 can operate in a networked environment using logical connections to one or more remote computers, such as remote computer(s) 3944. The remote computer(s) 3944 can be a computer, a server, a router, a network PC, a workstation, a microprocessor-based appliance, a peer device or other common network node and the like, and typically can also include many or the elements described relative to computer 3912. For purposes of brevity, only a memory storage device 3946 is illustrated with remote computer(s) 3944. Remote computer(s) 3944 is logically connected to computer 3912 through a network interface 3948 and then physically connected via communication connection 3950. Network interface 3948 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 3950 refers to the hardware/software employed to connect the network interface 3948 to the system bus 3918. While communication connection 3950 is shown for illustrative clarity inside computer 3912, it can also be external to computer 3912. The hardware/software for connection to the network interface 3948 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum device, comprising:
   a dielectric layer comprising a recess formed in a first surface of the dielectric layer, wherein the recess reduces a thickness of the dielectric layer from a first thickness external to a footprint of the recess to a second thickness within the footprint of the recess, and wherein the second thickness is less than the first thickness;
   a first electrode positioned within the footprint of the recess; and
   a second electrode positioned on a second surface of the dielectric layer and electrically isolated from the first electrode by the dielectric layer, wherein the first surface and the second surface are opposing surfaces of the dielectric layer.

2. The quantum device of claim 1, further comprising:
   a third electrode positioned on the first surface of the dielectric, wherein a gap intervenes between the first electrode and the third electrode.

3. The quantum device of claim 2, wherein the first electrode is coupled to a Josephson junction positioned within the gap.

4. The quantum device of claim 2, wherein the first electrode and the second electrode form a first capacitance, and wherein the second electrode and the third electrode form a second capacitance.

5. The quantum device of claim 1, wherein the first electrode comprises a rounded edge that interfaces with a sidewall of the recess and a recess surface of the dielectric layer within the footprint of the recess.

6. The quantum device of claim 1, wherein the recess has a depth of at least 0.3 micrometers.

7. The quantum device of claim 1, wherein a sidewall of the recess undercuts the surface of the dielectric layer in which the recess is formed.

8. The quantum device of claim 1, wherein the first electrode comprises a superconductor material.

9. The quantum device of claim 1, further comprising:
a shielding structure positioned between the first electrode and a first qubit that is adjacent to the first electrode, wherein the shielding structure facilitates cross talk reduction, and wherein the shielding structure electrically couples the second electrode with a conductive element positioned on the first surface that provides a ground potential.

10. The quantum device of claim 9, wherein the first electrode and the second electrode comprise a second qubit, and wherein the shielding structure further facilitates decoupling the second qubit and the first qubit.

11. The quantum device of claim 1, wherein the dielectric layer is an epitaxially grown layer.

12. The quantum device of claim 1, further comprising:
a handle layer that provides structural support to the dielectric layer, wherein the second electrode intervenes between the dielectric layer and the handle layer.

13. The quantum device of claim 1, wherein the second thickness of the dielectric layer within the footprint of the recess is less than at least one dimension of the first electrode.

14. A quantum device, comprising:
a first capacitor having first and second electrodes that are electrically isolated by a dielectric layer intervening between the first electrode and second electrodes, wherein the first and second electrodes are positioned on opposing surfaces of the dielectric layer, wherein the first electrode is positioned within a footprint of a recess formed in a surface of the dielectric layer that reduces a thickness of the dielectric layer from a first thickness external to a footprint of the recess to a second thickness within the footprint of the recess, and wherein the second thickness is less than the first thickness; and
a Josephson junction coupled to the first electrode of the first capacitor, wherein the Josephson junction is positioned on the surface of the dielectric layer in a gap that intervenes between the first electrode and a third electrode of a second capacitor.

15. The quantum device of claim 14, wherein the third electrode is positioned within another recess formed in the surface of the dielectric layer.

16. The quantum device of claim 14, wherein the third electrode and the second electrode form the second capacitor.

17. The quantum device of claim 14, wherein the second capacitor is in series with the first capacitor.

18. The quantum device of claim 14, wherein the first electrode comprises a rounded edge that interfaces with a sidewall of the recess and a recess surface of the dielectric layer within the footprint of the recess.

19. The quantum device of claim 14, wherein a sidewall of the recess undercuts the surface of the dielectric layer in which the recess is formed.

20. The quantum device of claim 14, further comprising:
a shielding structure positioned between the first electrode and a first qubit that is adjacent to the first electrode, wherein the shielding structure facilitates crosstalk reduction, and wherein the shielding structure electrically couples the second electrode with a conductive element positioned on the surface that provides a ground potential.

21. The quantum device of claim 20, wherein the first electrode and the second electrode comprise a second qubit, and wherein the shielding structure further facilitates decoupling the second qubit and the first qubit.

* * * * *